United States Patent
Ikezaki

(10) Patent No.: US 7,019,523 B2
(45) Date of Patent: Mar. 28, 2006

(54) NUCLEAR MAGNETIC RESONANCE IMAGING APPARATUS AND NUCLEAR MAGNETIC RESONANCE IMAGING METHOD

(75) Inventor: Yoshikazu Ikezaki, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 112 days.

(21) Appl. No.: 10/798,689

(22) Filed: Mar. 11, 2004

(65) Prior Publication Data

US 2004/0189299 A1 Sep. 30, 2004

(30) Foreign Application Priority Data

Mar. 12, 2003 (JP) ............................. 2003-066555

(51) Int. Cl.
*G01V 3/00* (2006.01)
(52) U.S. Cl. ........................................ 324/309; 324/307
(58) Field of Classification Search ................ 324/309, 324/307, 306, 312, 314, 318, 319, 322, 300; 600/410, 421, 422
See application file for complete search history.

(56) References Cited

U.S. PATENT DOCUMENTS

| | | | |
|---|---|---|---|
| 4,937,526 A | 6/1990 | Ehman et al. | |
| 5,109,854 A | 5/1992 | Provost | |
| 6,469,506 B1 * | 10/2002 | Felmlee et al. | ............. 324/309 |
| 6,498,485 B1 | 12/2002 | Miyosi et al. | |
| 6,512,372 B1 | 1/2003 | Ikezaki | |
| 6,803,763 B1 * | 10/2004 | Peters et al. | ................ 324/319 |
| 6,842,001 B1 * | 1/2005 | Ikezaki | ....................... 324/309 |

FOREIGN PATENT DOCUMENTS

| | | |
|---|---|---|
| EP | 1391746 A2 | 8/2003 |
| JP | 2002-248089 | 9/2002 |
| WO | WO-03/052442 A1 | 6/2003 |

OTHER PUBLICATIONS

Pruessmann, et al., Magnetic Resonance in Medicine 42:952-962 (1999), "SENSE: Sensitivity Encoding for Fast MRI," Institute of Biomedical Engineering and Medical Informatics, University of Zürich and Swiss Federal Institute of Technology Zürich, Zürich, Switzerland.

(Continued)

*Primary Examiner*—Louis Arana
(74) *Attorney, Agent, or Firm*—Carl B. Horton, Esq.; Armstrong Teasdale LLP

(57) ABSTRACT

An apparatus for removing wraparound artifacts without degrading image quality of an image includes a phase correcting section for conducting phase correction processing on received signals in an actual scan based on a reference signal as a corrective signal received by one of a plurality of receive coils, for example, by a receive coil, without applying a gradient magnetic field Gp in a phase encoding direction, and an unfolding section for removing wraparound artifacts in an image based on the signals received by the plurality of receive coils in the actual scan and subjected to the phase correction processing by the phase correcting section, and on the difference in sensitivity distribution among the plurality of receive coils, so that the phase correction processing is conducted while preserving the relative phase relationship among the coils, and unfolding processing (removal processing) is conducted using the result of such phase correction processing.

18 Claims, 13 Drawing Sheets

OTHER PUBLICATIONS

Munich European Search Report; Application No. EP04251388; Jun. 6, 2005; Examiner W. Lersch; 2 pgs.

Bammer, Roland; Basic Principles of Diffusion-Weighted Imaging; European Journal of Radiology 45 (2003) (XP-002313694) 169-184.

* cited by examiner

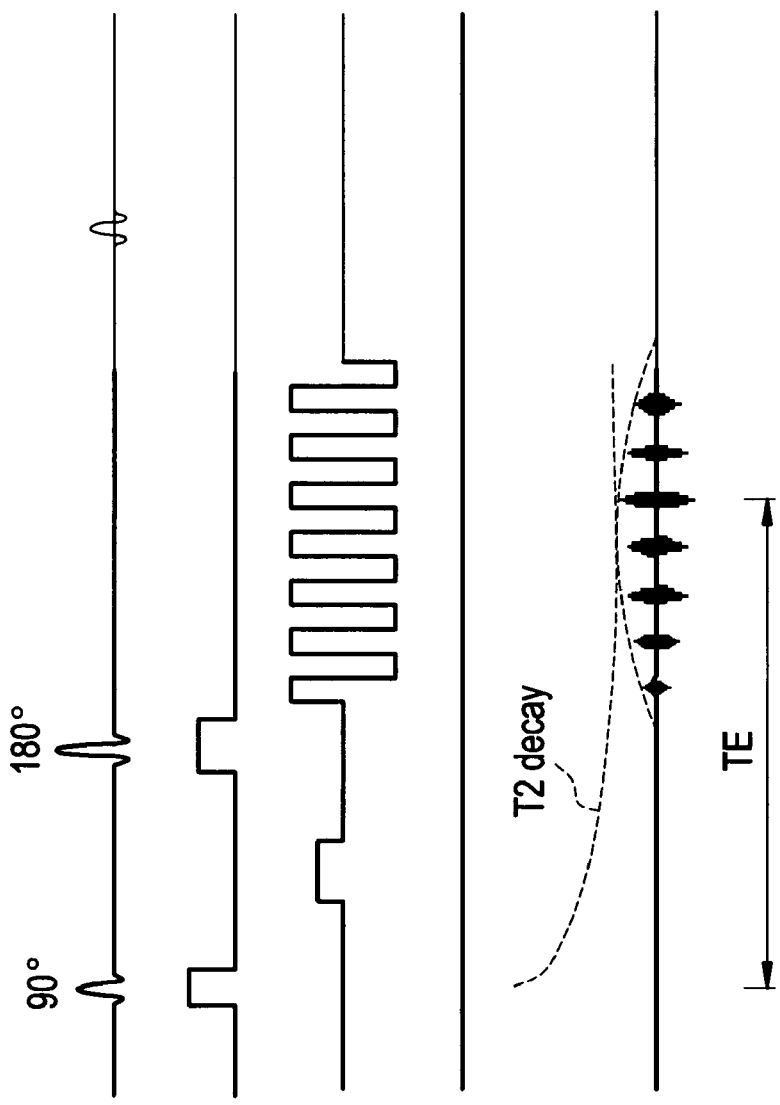

NUCLEAR MAGNETIC RESONANCE IMAGING APPARATUS AND NUCLEAR MAGNETIC RESONANCE IMAGING METHOD

CROSS REFERENCE TO RELATED APPLICATIONS

This application claims the benefit of Japanese Application No. 2003-066555 filed Mar. 12, 2003.

BACKGROUND OF THE INVENTION

The present invention relates to a nuclear magnetic resonance imaging apparatus and nuclear magnetic resonance imaging method for producing an image based on nuclear magnetic resonance signals from, for example, hydrogen atoms within a subject.

There is known a nuclear magnetic resonance imaging (MRI) apparatus for producing an image representing, for example, a nucleus density distribution or a relaxation time distribution based on nuclear magnetic resonance signals.

In recent years, there has become known a parallel imaging technique that employs a plurality of receive coils to conduct a high-speed scan with the field of view (FOV) reduced in the phase encoding direction, removes wraparound artifacts generated by aliasing from an image containing them based on the difference in sensitivity distribution among the plurality of coils, and obtains an image with a large field of view (sometimes referred to as a Full FOV). (For example, see non-Patent Document 1).

Moreover, also known is a nuclear magnetic resonance imaging apparatus for using such a technique to remove wraparound artifacts and produce a Full-FOV image. (For example, see Patent Document 1).

Patent Document 1

Japanese Patent Application Laid Open No. 2002-248089.

Non-Patent Document 1

Pruessmann, K. P, Weiger, M. Sheidegger, M. B., and Boesiger, P., *Magn. Reson. Med.*, 42, 952, 1999.

The magnetic resonance image apparatus described above, however, poses a problem that when nuclear magnetic resonance signals are received by, for example, an EPI pulse sequence and an image is produced using the parallel imaging technique as described above, image quality is degraded due to an inhomogeneous magnetic field or the like; and the problem is desired to be reduced or eliminated.

SUMMARY OF THE INVENTION

Therefore, an object of the present invention is to provide a nuclear magnetic resonance imaging apparatus and nuclear magnetic resonance method capable of removing wraparound artifacts without degrading image quality.

A first aspect of the present invention for attaining the aforesaid object is a nuclear magnetic resonance imaging apparatus for removing wraparound artifacts from an image produced from signals received by a plurality of coils based on the difference in sensitivity distribution among said plurality of coils, said apparatus comprising: phase correction processing means for conducting phase correction processing on the signals received by said plurality of coils based on a corrective signal received by one of said plurality of coils while applying no gradient magnetic field in a phase encoding direction; and removing means for removing wraparound artifacts in said image based on the signals received by said plurality of coils and subjected to said phase correction processing by said phase correction processing means, and on the difference in sensitivity distribution among said plurality of coils.

According to the first aspect of the present invention, the phase correction processing means conducts phase correction processing on signals received by a plurality of coils based on a corrective signal received by one of the plurality of coils while applying no gradient magnetic field in a phase encoding direction.

The removing means removes wraparound artifacts in the image based on the signals received by the plurality of coils and subjected to the phase correction processing by the phase correction processing means, and on the difference in sensitivity distribution among the plurality of coils.

Moreover, a second aspect of the present invention for attaining the aforesaid object is a nuclear magnetic resonance imaging apparatus for removing wraparound artifacts from an image produced from signals received by a plurality of coils based on the difference in sensitivity distribution among said plurality of coils, said apparatus comprising: gradient magnetic field generating means for generating gradient magnetic fields in a readout direction, a frequency encoding direction and a phase encoding direction; pulse generating means for applying 90° and 180° pulses for exciting nuclear magnetization; phase correcting means for, based on one of navigator signals received by one of said coils while applying no gradient magnetic field in said phase encoding direction and applying said gradient magnetic field in said readout direction by said gradient magnetic field generating means within the same excitation period, conducting phase correction processing on the signals received by said plurality of coils while applying a gradient magnetic field in said phase encoding direction and applying a gradient magnetic field in said readout direction with the polarity consecutively inverted by said gradient magnetic field generating means within an excitation period; and removing means for removing wraparound artifacts in said image based on the signals received by said plurality of coils and subjected to said phase correction processing by said phase correction processing means, and on the difference in sensitivity distribution among said plurality of coils.

Furthermore, a third aspect of the present invention for attaining the aforesaid object is a nuclear magnetic resonance imaging method for removing wraparound artifacts from an image produced from signals received by a plurality of coils based on the difference in sensitivity distribution among said plurality of coils, said method comprising: a first step of conducting phase correction processing on the signals received by said plurality of coils based on a corrective signal received by one of said plurality of coils while applying no gradient magnetic field in a phase encoding direction; and a second step of removing wraparound artifacts in said image based on the signals received by said plurality of coils and subjected to said phase correction processing by said first step, and on the difference in sensitivity distribution among said plurality of coils.

Furthermore, a fourth aspect of the present invention for attaining the aforesaid object is a nuclear magnetic resonance imaging method for removing wraparound artifacts from an image produced from signals received by a plurality of coils based on the difference in sensitivity distribution among said plurality of coils, said method comprising: a first step of conducting phase correction processing on the signals received by said plurality of coils while applying a gradient magnetic field in a phase encoding direction and applying a gradient magnetic field in a readout direction with the polarity consecutively inverted within an excitation period, based on one of navigator signals received by one of said coils while applying no gradient magnetic field in said phase encoding direction and applying said gradient magnetic field in said readout direction within the same excitation period; and a second step of removing wraparound artifacts in said image based on the signals received by said plurality of coils and subjected to said phase correction processing by said first step, and on the difference in sensitivity distribution among said plurality of coils.

According to the present invention, there are provided a nuclear magnetic resonance imaging apparatus and a nuclear magnetic resonance method capable of removing wraparound artifacts without degrading image quality of an image.

Further objects and advantages of the present invention will be apparent from the following description of the preferred embodiments of the invention as illustrated in the accompanying drawings.

BRIEF DESCRIPTION OF THE DRAWINGS

FIG. 4 is a chart of a pulse sequence for acquiring a reference signal for the nuclear magnetic resonance imaging apparatus shown in FIG. 1.

DETAILED DESCRIPTION OF THE INVENTION

A nuclear magnetic resonance imaging apparatus 100 in accordance with a first embodiment of the present invention implements a parallel imaging technique for, for example, producing an image containing wraparound artifacts based on signals received by a plurality of coils and producing an image with the wraparound artifacts removed based on the difference in sensitivity distribution among the plurality of coils, and in such a technique, the nuclear magnetic resonance imaging apparatus 100 conducts phase correction processing on the signals received by the plurality of coils based on a corrective signal incorporating additive information in the phase encoding direction received by one of the plurality of coils, and removes wraparound artifacts in the image based on the signals received by the plurality of coils and subjected to the phase correction processing, and on the difference in sensitivity distribution among the plurality of coils.

The wraparound artifacts occur as a result of aliasing when a plurality of receive coils are used to conduct a high-speed scan with the field of view (FOV) reduced in the phase encoding direction, in which scan phase encoding steps are skipped, for example.

An embodiment of the present invention will now be described with reference to accompanying drawings.

Figure 1:
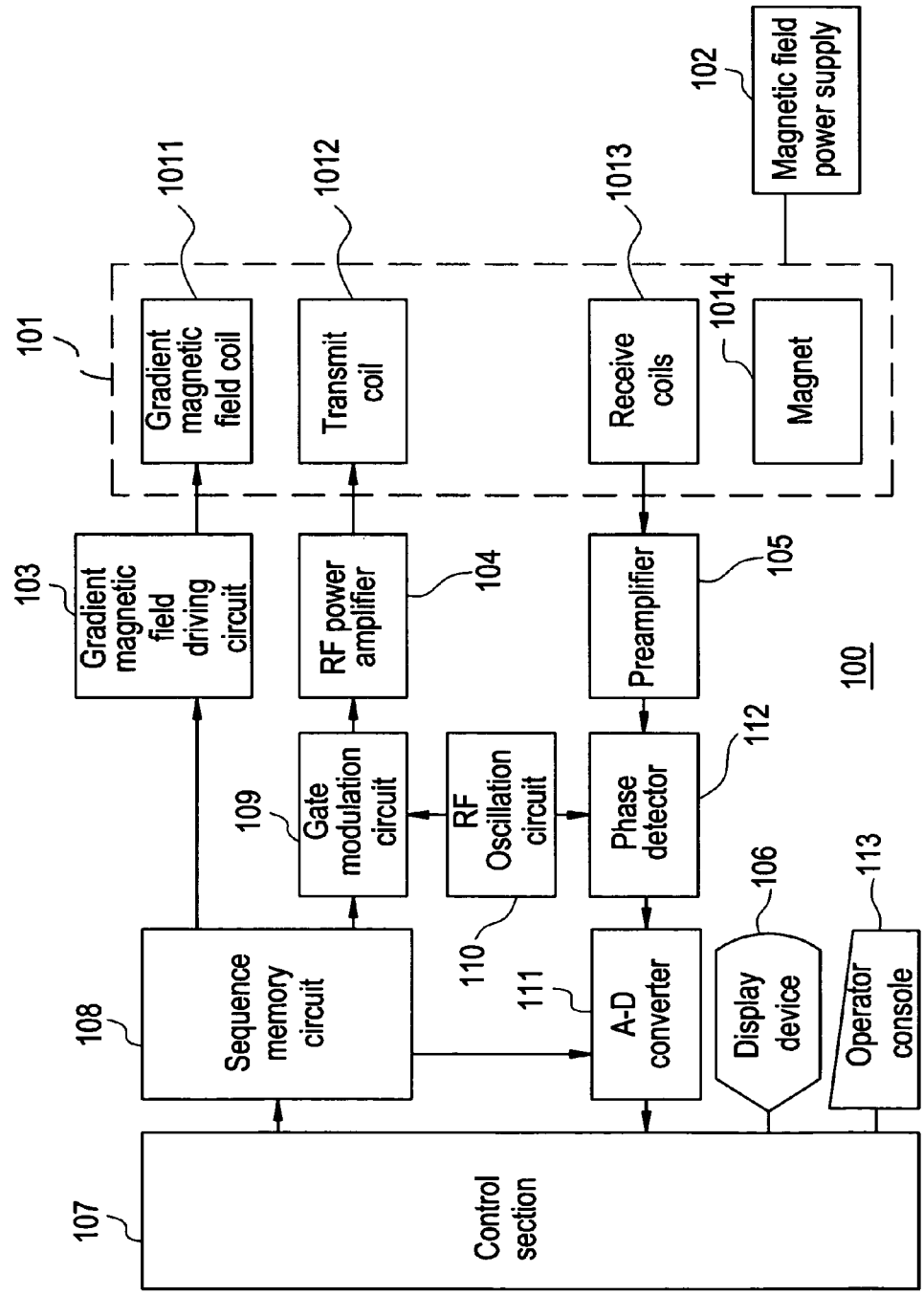
FIG. 1 is a block diagram showing a first embodiment of a nuclear magnetic resonance imaging apparatus in accordance with the present invention.
Figure 2:
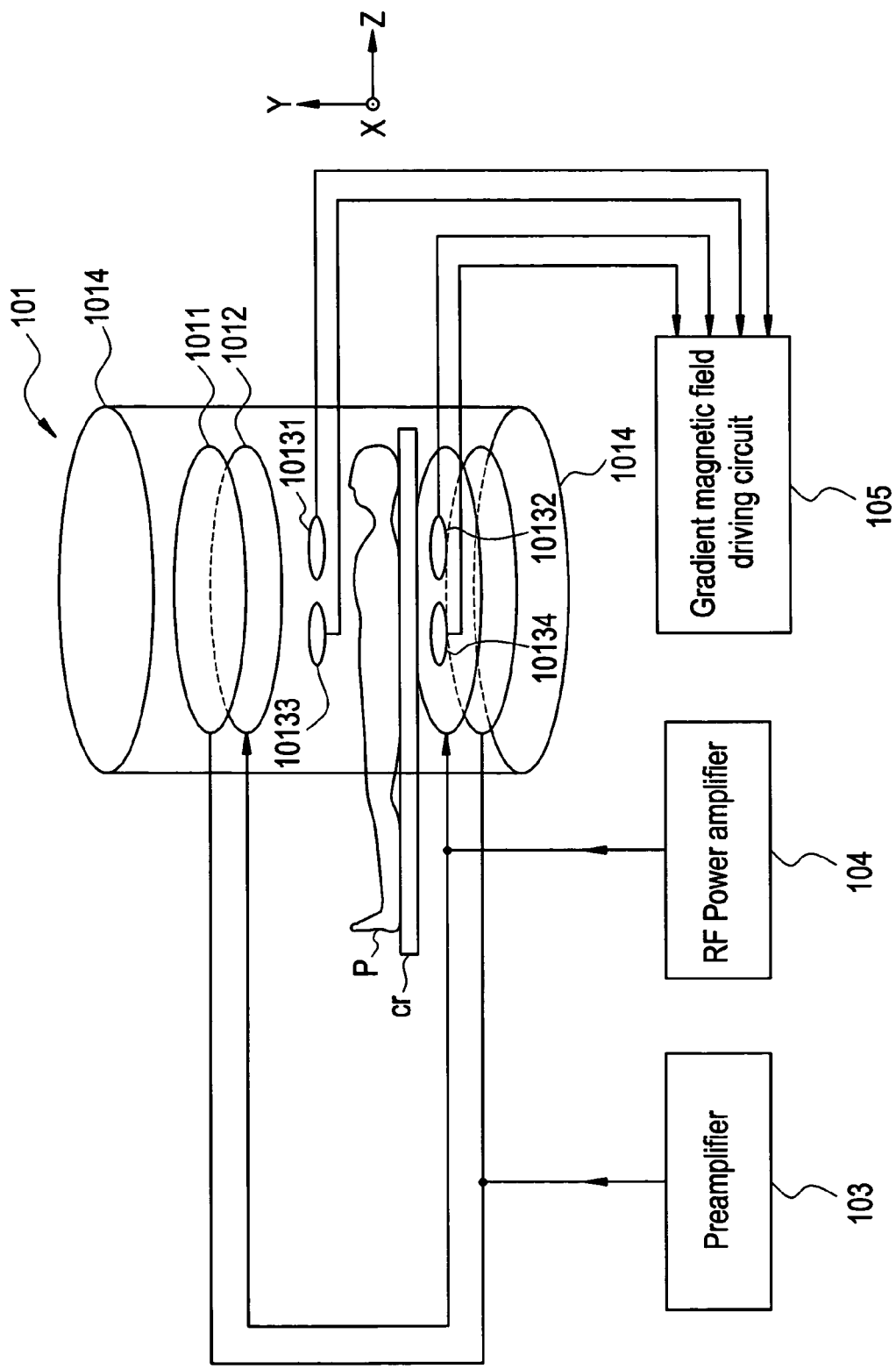
FIG. 2 is a cross-sectional view of a magnet assembly in the nuclear magnetic resonance imaging apparatus shown in FIG. 1.

FIG. 1 is a block diagram showing a first embodiment of a nuclear magnetic resonance imaging apparatus in accordance with the present invention. FIG. 2 is a cross-sectional view of a magnet assembly in the nuclear magnetic resonance imaging apparatus shown in FIG. 1.

As shown in FIGS. 1 and 2, the nuclear magnetic resonance imaging apparatus 100 in accordance with the present embodiment comprises a magnet assembly 101, a magnetic field power supply 102, a gradient magnetic field driving circuit 103, an RF power amplifier 104, a preamplifier 105, a display device 106, a control section 107, a sequence memory circuit 108, a gate modulation circuit 109, an RF oscillation circuit 110, an A-D converter 111, a phase detector 112, and an operator console 113.

The magnet assembly 101 has, as shown in FIG. 2, a cavity portion (bore) therein for inserting a subject p, and applies a predetermined magnetic field, for example, a vertical magnetic field, to the subject p so as to surround the cavity portion.

The magnet assembly 101 comprises a gradient magnetic field coil 1011, a transmit coil 1012, receive coils 1013, and a magnet 1014, as shown in FIG. 2 in detail.

The gradient magnetic field coil 1011 generates gradient magnetic fields appended to the intensity of the static magnetic field generated by the magnet 1014, for incorporating three-dimensional positional information into magnetic resonance signals received by the receive coils 1013. For example, the gradient magnetic field coil 1011 is comprised of X-, Y-, and Z-axis coils.

The gradient magnetic fields generated by the gradient magnetic field coil 1011 are the following three: a slice gradient magnetic field in a slice direction, a readout gradient magnetic field in a readout direction, and a gradient magnetic field in a phase encoding direction (sometimes referred to as a phase encoding gradient magnetic field), each generated by a combination of magnetic fields along X-, Y-, and Z-axes.

The transmit coil 1012 generates and outputs pulsed signals of a high frequency electromagnetic field, for example, 90° and 180° excitation pulses, for exciting proton spins of, for example, hydrogen atoms within the subject p on a cradle cr, in a magnetic field space generated by the gradient magnetic field coil 1011.

The receive coils 1013 receive nuclear magnetic resonance signals output in response to rotational motion of the proton spins of, for example, hydrogen atoms within the subject p, and outputs the signals to the preamplifier 105.

The receive coils 1013 comprise a plurality of receive coils, for example, receive coils 10131–10134 as shown in FIG. 2. For example, the receive coils 10131 and 10133 are disposed above the subject p, and the receive coils 10132 and 10134 are disposed on the side opposite to the receive coils 10131 and 10133 with respect to the cradle cr and subject p.

Each receive coil 1013 is, for example, a phased-array coil. The phased-array coil is used to improve sensitivity and enlarge the field of view while maintaining the high sensitivity of an RF receive coil, by arranging a plurality of small RF receive coils having relatively high sensitivity, and combining signals received by these coils.

The magnet 1014 is disposed to surround the subject p, and is, for example, a normal conductive magnet that applies a constant static magnetic field to the subject p depending upon a supplied power from the magnetic field power supply 102. The magnet 1014 is however not limited to the present embodiment. For example, the magnet 1014 may be a permanent magnet or a super-conductive magnet.

The gradient magnetic field driving circuit 103 outputs driving signals for causing the gradient magnetic field coil 101 to generate the gradient magnetic fields under control by the sequence memory circuit 108.

The RF power amplifier 104 amplifies RF signals output from the gate modulation circuit 109, and outputs them to the transmit coil 1012.

The preamplifier 105 amplifies nuclear magnetic resonance signals from the subject p detected at the receive coils 1013, and outputs them to the phase detector 112.

The display device 106 conducts predetermined display under control by the control section 107.

The control section 107 is for exchanging information with the operator console 113, switching the operation of the sequence memory circuit 108 to implement several kinds of pulse sequences, and rewriting the memory, and conducts processing in accordance with the present embodiment based on several kinds of data output from the A-D converter 111.

The sequence memory circuit 108 operates the gate modulation circuit 109 in an arbitrary view (i.e., causes the circuit 109 to modulate high frequency output signals from the RF oscillation circuit 110 at predetermined times) under control by the control section 107, and applies high frequency pulsed signals to the RF transmit coil 1012 via the RF power amplifier 104 according to a predefined pulse sequence.

Moreover, the sequence memory circuit 108 operates the gradient magnetic field driving circuit 103, gate modulation circuit 109 and A-D converter 111 by sequence signals based on a Fourier transformation technique. The sequence memory circuit 108 operates the gate modulation circuit 109 and gradient magnetic field driving circuit 103 to achieve selective excitation in a desired direction, before starting the series of sequence operations as described above.

The gate modulation circuit 109 modulates high frequency output signals from the RF oscillation circuit 110 at predetermined times based on the signals from the sequence memory circuit 108.

The RF oscillation circuit 110 generates an RF signal carrier of a predetermined frequency, and outputs it to the gate modulation circuit 109 and phase detector 112.

The A-D converter 111 conducts conversion processing from analog signals phase-detected by the phase detector 112 to digital signals, and outputs them to the control section 107.

The phase detector 112 phase-detects the output signals (those detected by the receive coils) from the preamplifier circuit 5 with reference to the output signal from the RF oscillation circuit 110, and outputs them to the A-D converter 111.

The operator console 113 outputs a signal in response to, for example, an operation by a user, to the control section 107.

The nuclear magnetic resonance imaging apparatus 100 of the present embodiment conducts a reference scan, a calibration scan and an actual scan, and produces an image according to the parallel imaging technique.

Figures 3A, 3B, 3C, 3D, 3E:
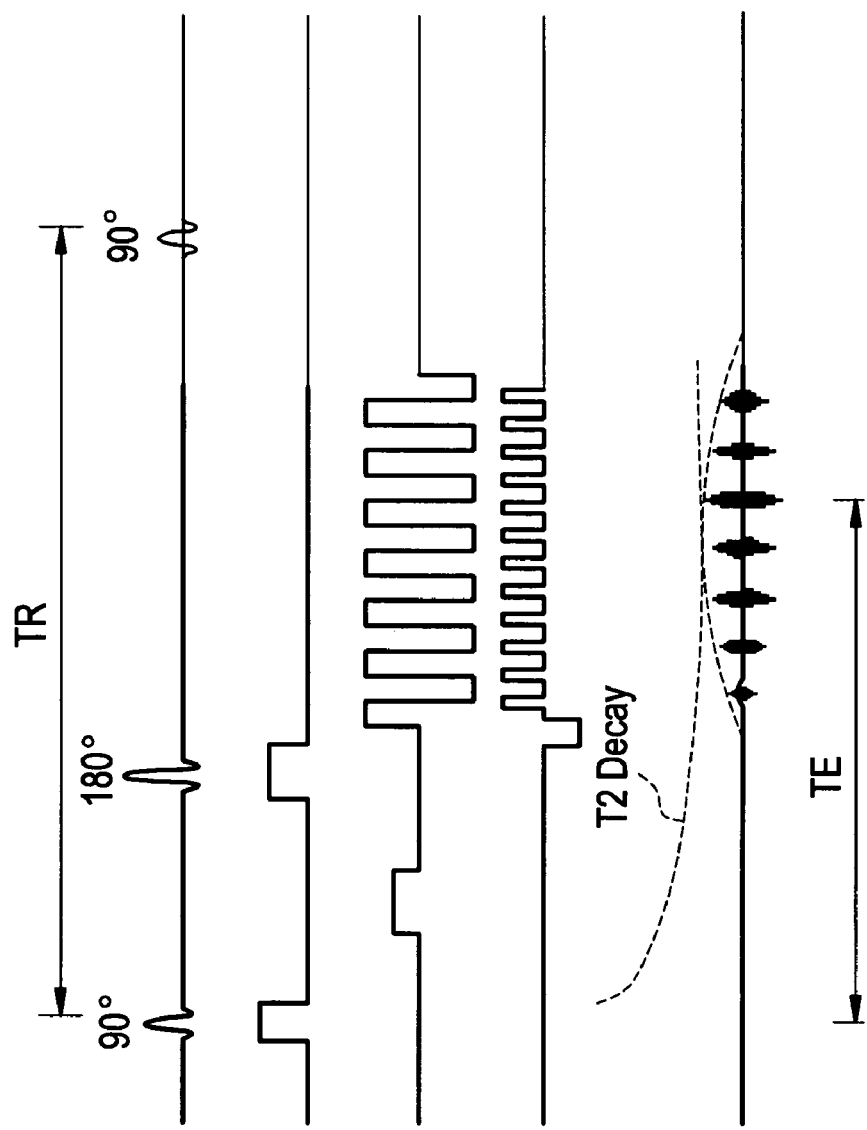
FIG. 3 shows an exemplary pulse sequence for an actual scan by the nuclear magnetic resonance imaging apparatus shown in FIG. 1.

FIG. 3 shows an exemplary pulse sequence for the actual scan by the nuclear magnetic resonance imaging apparatus shown in FIG. 1.

The pulse sequence for the actual scan by the nuclear magnetic resonance imaging apparatus 100 generates, for example, nuclear magnetic resonance signals according to an echo planar imaging (EPI) technique, as shown in FIG. 3. The EPI technique repeatedly inverts the polarity of the gradient magnetic field Gr in the readout direction during collection of nuclear magnetic resonance signals after the RF pulse signals to generate a large number of gradient echoes, and receives the nuclear magnetic resonance signals. The actual scan conducts a high-speed scan by reducing the phase encoding steps in the phase encoding direction as described above.

FIG. 3(*a*) shows RF pulses output by the transmit coil 1012, illustrating a sequence of 90° excitation pulse and 180° excitation pulses; FIGS. 3(*b*), (*c*) and (*d*) show sequences of the slice gradient magnetic field Gs, readout gradient magnetic field Gr, and phase encoding gradient magnetic field Gp; and FIG. 3(*e*) is the sequence of a nuclear magnetic resonance signal.

As shown in FIG. 3(*a*), when the sequence memory circuit 108 outputs a control signal for applying a 90° pulse under control by the control section 107, the transmit coil 1012 outputs a 90° pulse via the gate modulation circuit 109 and RF power amplifier 104 to achieve 90° excitation on nuclear magnetization. At that time, the gradient magnetic field driving circuit 103 outputs a slice gradient pulse to the gradient magnetic field coil 1011, and the gradient magnetic field coil 1011 generates the slice gradient magnetic field Gs to achieve selective excitation in a predetermined slice, as shown in FIG. 3(*b*).

As shown in FIG. 3(*c*), after a predetermined time period from the 90° excitation, the gradient magnetic field driving circuit 103 causes the gradient magnetic field coil 1011 to apply the readout gradient magnetic field Gr under control by the sequence memory circuit 108.

As shown FIG. 3(*a*), after an additional predetermined time period from the 90° excitation, a 180° excitation pulse is output from the transmit coil 1012 via the gate modulation circuit 109 and RF power amplifier 104 under control by the sequence memory circuit 108. At that time, as shown in FIG. 3(*b*), the gradient magnetic field driving circuit 103 outputs a slice gradient pulse to the gradient magnetic field coil 1011, and the gradient magnetic field coil 1011 generates the slice gradient magnetic field Gs to achieve selective excitation for the predetermined slice.

As shown in FIG. 3(*c*), after the 180° excitation, the gradient magnetic field driving circuit 103 applies to the gradient magnetic field coil 1011 readout gradient magnetic field pulses whose polarity in the readout direction is consecutively inverted, and the gradient magnetic field coil 1011 generates a gradient magnetic field whose polarity is consecutively inverted in the readout direction.

At that time, as shown in FIG. 3(*d*), the gradient magnetic field driving circuit 103 outputs a signal for causing the gradient magnetic field coil 1011 to generate a predetermined phase encoding gradient magnetic field, and the gradient magnetic field coil 1011 generates the phase encoding gradient magnetic field, for example, the blip-pulsed gradient magnetic field as shown in FIG. 3(*d*), in response to the signal.

As shown in FIG. 3(*e*), spin echoes are generated as a result of rephasing by the readout gradient magnetic field Gr, and the receive coils 1013 receive a nuclear magnetic resonance signal (or MR signal). The signal received by the receive coils 1013 is output to the control section 107 as raw data via the preamplifier 105, phase detector 112, and A-D converter 111.

FIG. 4 is a pulse sequence chart for acquiring a reference signal for the nuclear magnetic resonance imaging apparatus shown in FIG. 1.

The reference signal is the nuclear magnetic resonance signal that is received while applying no phase encoding gradient magnetic field. The reference signal corresponds to the corrective signal in accordance with the present invention. An exemplary reference scan by a pulse sequence for generating the reference signal will be described with reference to FIG. 4.

FIG. 4(*a*) shows RF pulses output by the transmit coil 1012, illustrating a sequence of 90° and 180° pulses; FIGS. 4(*b*), (*c*) and (*d*) show sequences of the slice gradient magnetic field Gs, readout gradient magnetic field Gr, and phase encoding gradient magnetic field Gp; and FIG. 4(*e*) is the sequence of a nuclear magnetic resonance signal.

In the reference sequence, a scan is conducted without applying a phase encoding gradient magnetic field Gp, as shown in FIG. 4(*d*). The nuclear magnetic resonance signal received in this condition incorporates therein additive information in the phase encoding direction.

More specifically, as shown in FIG. 4(*a*), when the sequence memory circuit 108 outputs a control signal for applying a 90° pulse under control by the control section 107, the transmit coil 1012 outputs a 90° pulse via the gate modulation circuit 109 and RF power amplifier 104 to achieve 90° excitation on nuclear magnetization. At that time, the gradient magnetic field driving circuit 103 outputs a slice gradient pulse to the gradient magnetic field coil 1011, and the gradient magnetic field coil 1011 generates the slice gradient magnetic field Gs to achieve selective excitation in a predetermined slice, as shown in FIG. 4(*b*).

As shown in FIG. 4(*c*), after a predetermined time period from the 90° excitation, the gradient magnetic field driving circuit 103 causes the gradient magnetic field coil 1011 to apply the readout gradient magnetic field Gr under control by the sequence memory circuit 108.

As shown in FIG. 4(*a*), after an additional predetermined time period from the 90° excitation, a 180° excitation pulse is output from the transmit coil 1012 via the gate modulation circuit 109 and RF power amplifier 104 under control by the sequence memory circuit 108. At that time, as shown in FIG. 4(*b*), the gradient magnetic field driving circuit 103 outputs a slice gradient pulse to the gradient magnetic field coil 1011, and the gradient magnetic field coil 1011 generates the slice gradient magnetic field Gs to achieve selective excitation in the predetermined slice.

As shown in FIG. 4(*c*), after the 180° excitation, the gradient magnetic field driving circuit 103 applies readout gradient magnetic field pulses whose polarity in the readout direction is consecutively inverted to the gradient magnetic field coil 1011, and the gradient magnetic field coil 1011 generates a gradient magnetic field whose polarity is consecutively inverted in the readout direction.

At that time, as shown in FIG. 4(*d*), no phase encoding gradient magnetic field Gp is applied.

As shown in FIG. 4(*e*), spin echoes are generated as a result of rephasing by the readout gradient magnetic field Gr, and the receive coils 1013 receive a nuclear magnetic resonance signal. The signal received by the receive coils 1013 is output to the control section 107 as the reference signal via the preamplifier 105, phase detector 112, and A-D converter 111. The reference signal corresponds to the corrective signal in accordance with the present invention.

Figure 5:
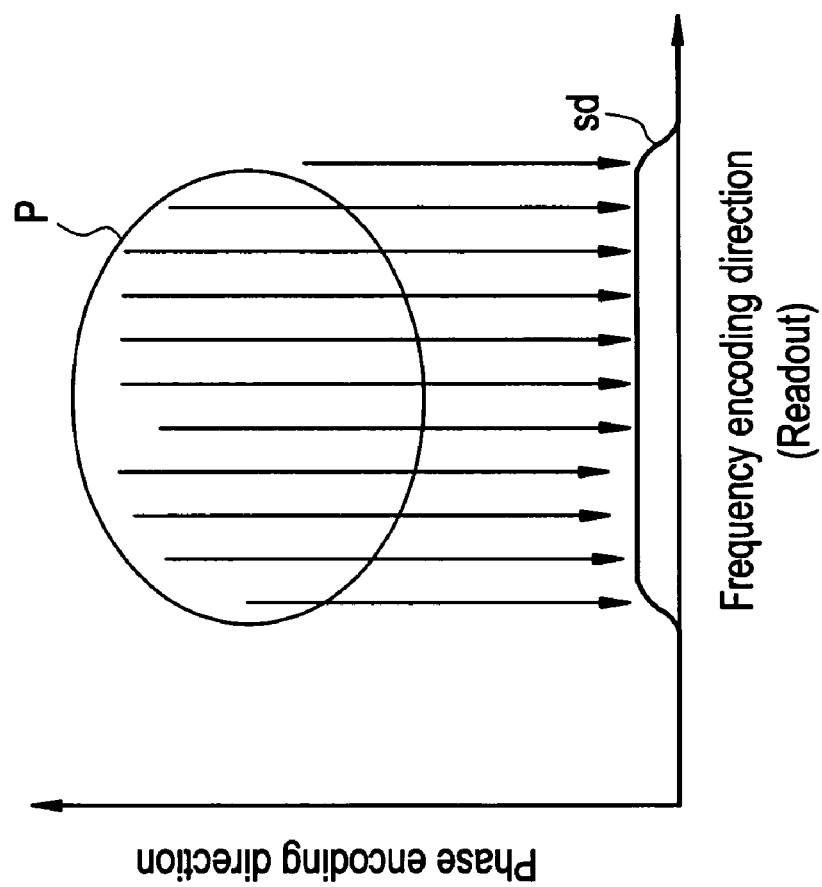
FIG. 5 is a diagram for explaining the reference signal.

FIG. 5 is a diagram for explaining the reference signal. The vertical axis represents the phase encoding direction, and the transverse axis represents the readout (frequency encoding) direction.

When a nuclear magnetic resonance signal is received without applying a gradient magnetic field in the phase encoding direction, nuclear magnetization of, for example, the subject p, rotates in a in-phase condition in the phase encoding direction. Thus received is a nuclear magnetic resonance signal based on the result of addition of the rotational motion of magnetization (additive information) along the phase encoding direction.

In other words, the reference signal represents a profile in the frequency encoding direction because it is not phase-encoded.

As shown in FIG. 5, when the received signal is subjected to inverse Fourier transformation in the readout direction, a signal distribution sd along the readout direction in FIG. 5 is obtained, for example. The distribution represents the magnitude and phase information in the readout direction. The MR signal received without applying a magnetic field in the phase encoding direction is employed as the corrective signal in phase correction processing for removing magnetic field inhomogeneity.

Figure 6:
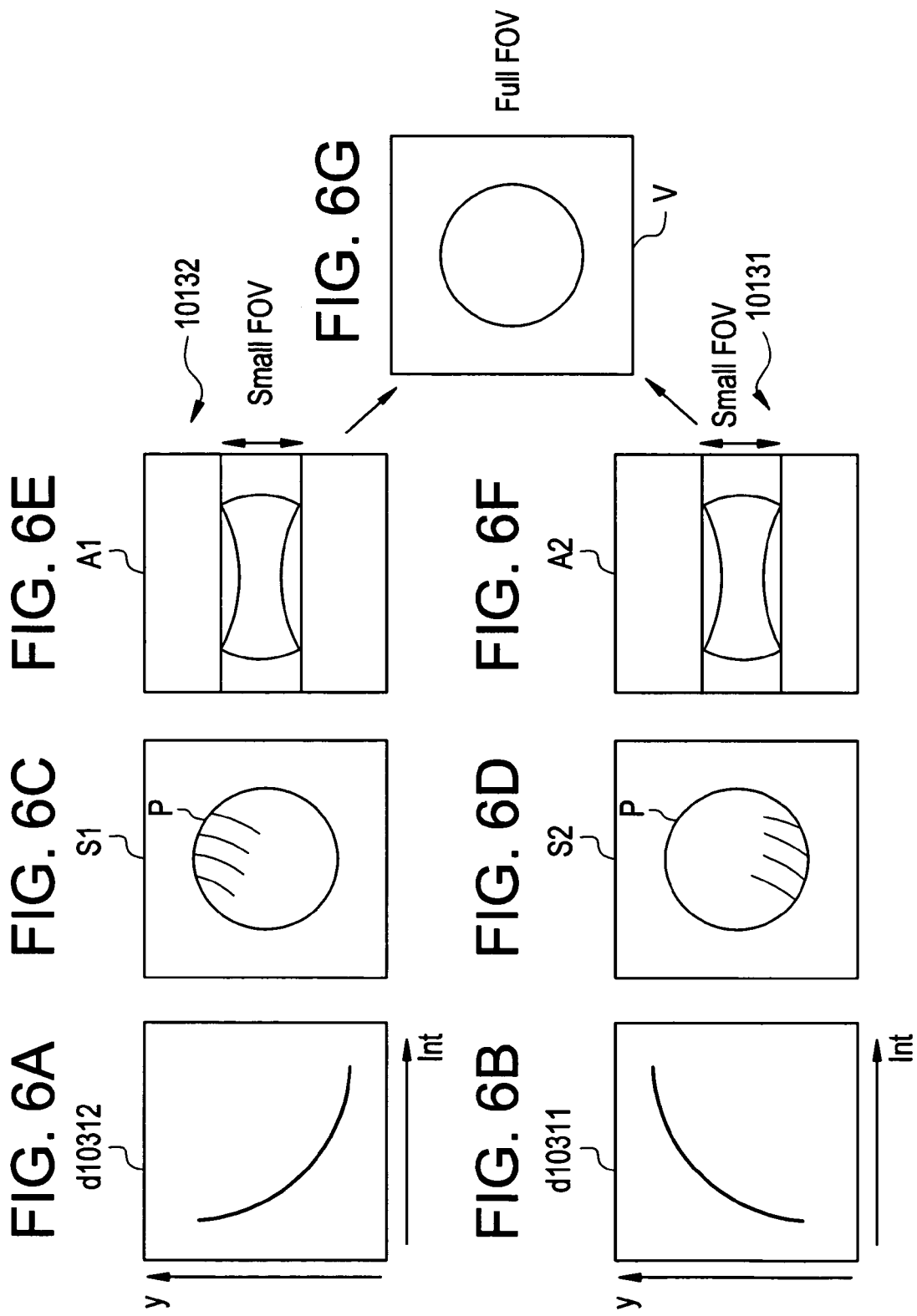
FIG. 6 is a diagram for explaining a parallel imaging technique by the nuclear magnetic resonance imaging apparatus shown in FIG. 1.

FIG. 6 is a diagram for explaining the parallel imaging technique by the nuclear magnetic resonance imaging apparatus shown in FIG. 1. FIG. 6(*a*) shows a sensitivity distribution versus the distance of the first coil, and FIG. 6(*b*) shows a sensitivity distribution versus the distance of the second coil.

For example, each of the receive coils 1013 has its own sensitivity distribution. For example, a receive coil 10132 has a sensitivity distribution d10132 as shown in FIG. 6(*a*), and a receive coil 10131 has a sensitivity distribution d10131 as shown in FIG. 6(*b*). In FIG. 6, the y-axis direction corresponds to the y-axis shown in FIG. 1, and the transverse axis represents the sensitivity intensity.

When a calibration scan is conducted and a calibration signal received by the receive coil 10132 is subjected to two-dimensional inverse Fourier transformation, an image S1 is obtained having sharp image quality in the lower portion of an image of the subject p and blurred image quality in the upper portion, as exemplarily shown in FIG. 6(*c*).

When a calibration signal received by the receive coil 10131 is subjected to two-dimensional inverse Fourier transformation, an image S2 is obtained having sharp image quality in the upper portion of an image of the subject p and blurred image quality in the lower portion, as exemplarily shown in FIG. 6(*d*)

In the calibration scan, a scan is conducted without scan step skipping during the scan in the phase encoding direction for obtaining the sensitivity distributions for the coils, and a Full-FOV image is obtained.

In the actual scan, to reduce the imaging time, the receive coils 10132 and 10131, for example, are used to conduct a scan with scan step skipping during the scan in the phase encoding direction, and then, two-dimensional Fourier transformation (inverse Fourier transformation) is performed to obtain images A1 and A2 with reduced field of view, i.e., with a Small FOV (field of view). In the Small-FOV actual scan, due to the scan with scan step skipping, images A1 and A2 containing wraparound artifacts caused by aliasing are obtained as shown in FIGS. 6(*e*) and (*f*). The parallel imaging technique is a method of conducting unfolding processing (removal processing) on the images A1 and A2 containing wraparound artifacts based on the difference in sensitivity distribution between the images S1 and S2 to produce an image V.

For the unfolding processing, an unfolding technique described in, for example, non-Patent Document, Pruessmann, K. P, Weiger, M. Sheidegger, M. B., and Boesiger, P., *Magn. Reson. Med,* 42, 952, 1999, is employed. The unfolding processing will be briefly described below.

A complex image V to be obtained with a Full FOV is derived by Equation (1) below, using a complex image A(coil index) obtained by a scan with a reduced FOV, and a sensitivity map (sensitivity matrix) S(coil index, pixel index) of the receive coils 1013.

The coil index designates a channel in the phased-array coil, and the pixel index is an index of wraparound and corresponds to a reduction factor R. For example, if R=2, a scan is conducted with ½ FOV, and the pixel index is up to two. S* is an adjoint (conjugate transpose) S* of the sensitivity map S.

[Equation 1]

$$V = (S^*S)^{-1}S^*A \quad (1)$$

The nuclear magnetic resonance imaging apparatus 100 in accordance with the present embodiment employs the echo planar imaging (EPI). The EPI is susceptible to static magnetic field inhomogeneity, and image distortion tends to occur. The image distortion is proportion to the sampling time. In the parallel imaging technique, if R=2, for example, FOV is ½, and thus the sampling rate in the ky-direction in the k-space is doubled, resulting in image distortion reduced to ½.

The nuclear magnetic resonance imaging apparatus 100 in accordance with the present embodiment conducts phase correction processing on received signals by the actual scan in the EPI, based on a corrective signal obtained in the reference scan in which no phase encoding gradient is applied.

If the phase correction processing on received signals by the actual scan by the receive coils 1013 is conducted using reference signals received by the receive coils 1013, the relative phase relationship between the coils is broken, and hence, a correct solution is difficult to calculate in the unfolding processing, i.e., processing for solving wraparound artifacts, in the parallel imaging. This will be described in detail below.

The sensitivity matrix S and collected image A with a reduced FOV are complex because of image reconstruction involving the unfolding processing in the parallel imaging technique given by Equation (1). As described before, when reception is conducted by the phased-array coils 1013, each coil in the phased-array coils 1013 has its own phase characteristic, and the sensitivity matrix S is complex, having phase information of each of the receive coils 1013.

The phase distributions of the image A obtained from the receive coils 1013 are different between the receive coils 1013. Accordingly, when Equation (1) is to be solved, the sensitivity matrix S must be complex, having phase information of each of the receive coils 1013.

When phase correction processing is performed on signals received by the receive coils 1013 in the actual scan based on corrective signals received by the receive coils 1013 in the reference scan, however, the relative phase relationship between the coils in the wraparound image A is broken, thereby degrading image quality. This is because phase information obtained from the coils in the reference scan is equivalent to that of the image A containing wraparound artifacts, and the relative phase relationship between the coils is canceled out by the correction.

On the other hand, since the relative phase relationship between the coils in the sensitivity matrix is still preserved, inconsistency occurs, and hence, artifacts occur.

Thus, when the nuclear magnetic resonance imaging apparatus 100 in accordance with the present embodiment conducts phase correction processing, it conducts the phase correction processing on signals received by the plurality of coils based on a reference signal received by one of the plurality of coils, i.e., based on a corrective signal incorporating additive information in the phase encoding direction.

Figure 7:
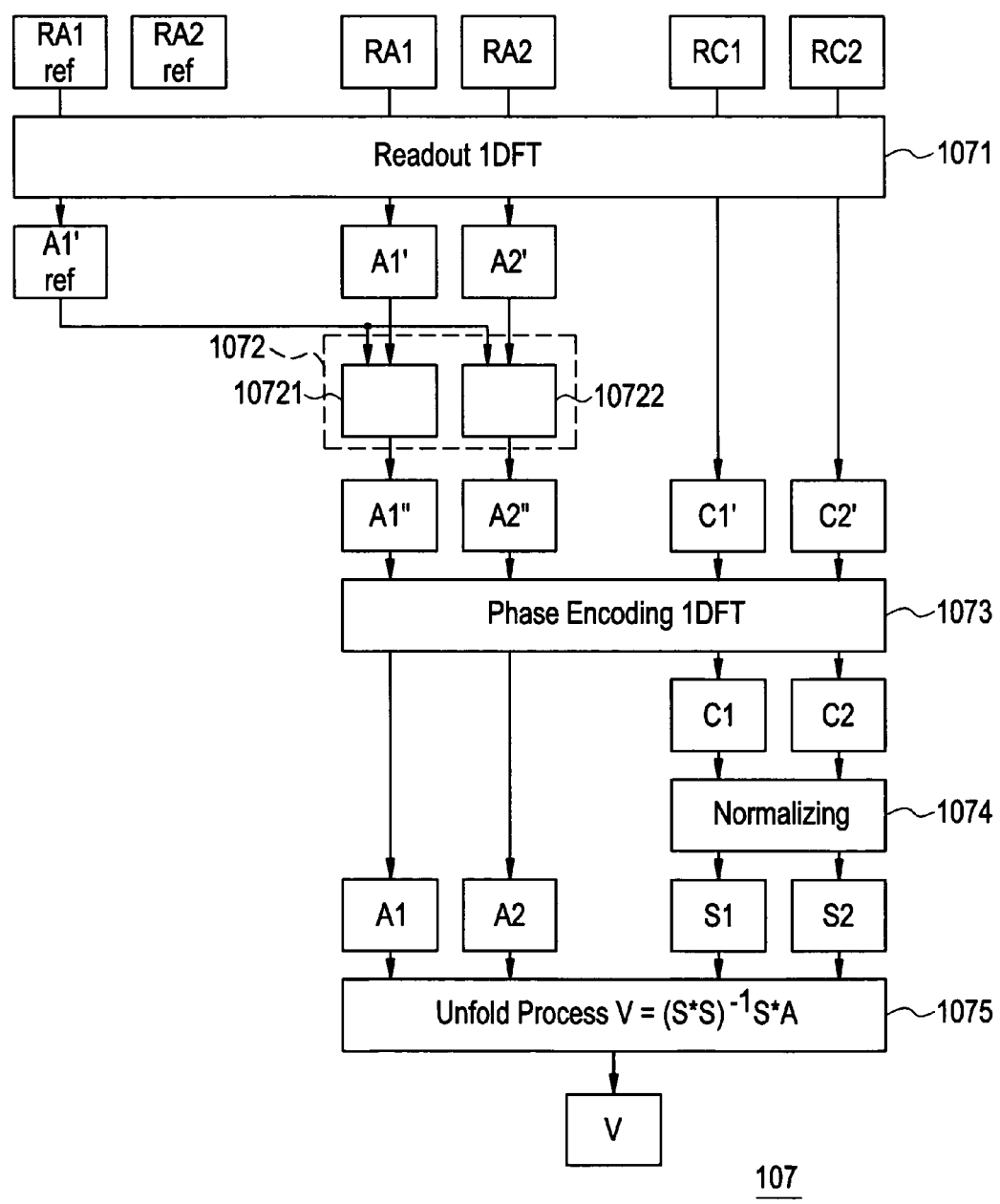
FIG. 7 is a functional block diagram of a control section in the nuclear magnetic resonance imaging apparatus shown in FIG. 1.

FIG. 7 is a functional block diagram of the control section in the nuclear magnetic resonance imaging apparatus shown in FIG. 1.

As shown in FIG. 7, the control section 107 comprises a first Fourier transformation section 1071, a phase correcting section 1072, a second Fourier transformation section 1073, a normalizing section 1074, and an unfolding section 1075.

The phase correcting section 1072 corresponds to the phase correction means in accordance with the present invention. The unfolding section 1075 corresponds to the removing means in accordance with the present invention. A case in which the receive coils 1013 comprise two receive coils 10131 and 10132, for example, will be described hereinbelow.

The first Fourier transformation section 1071 performs Fourier transformation (one-dimensional DFT: discrete Fourier transformation) in the readout direction based on signals received at the receive coils 1013. The Fourier transformation will sometimes referred to as inverse Fourier transformation herein. (Either is applicable by definition).

Specifically, the first Fourier transformation section 1071 performs one-dimensional Fourier transformation in the readout direction on a reference signal RA1ref received by one of the plurality of receive coils 1013, e.g., by the receive coil 10131, in a reference scan to generate a signal A1'ref, and outputs it to the phase correcting section 1072. The reference signal RA1ref corresponds to one-dimensional data in the readout direction.

The first Fourier transformation section 1071 also performs one-dimensional Fourier transformation in the readout direction on actual scan signals RA1 and RA2 received by the receive coils 10131 and 10132 in an actual scan to generate signals A1' and A2', and outputs them to the phase correcting section 1072. The actual scan signals RA1 and RA2 correspond to two-dimensional data.

The first Fourier transformation section 1071 performs 1DFT on calibration data RC1 and RC2 obtained in a calibration scan to generate C1' and C2', and outputs them to the second Fourier transformation section 1073. In the calibration scan, for example, a Full FOV scan is conducted beforehand, and data in a low-frequency region in the k-space is taken as calibration data. The calibration data RC1 and RC2 correspond to two-dimensional data.

The phase correcting section 1072 conducts phase correction processing on the received signals in the actual scan received by the plurality of receive coils based on the reference signal (corrective signal) received by one of the plurality of receive coils, and outputs the resulting signals to the second Fourier transformation section 1073.

The phase correcting section 1072 is comprised of respective phase correcting sections for the receive coils 1013, for example, comprised of a first phase correcting section 10721 and a second phase correcting section 10722, as shown in FIG. 7.

The first phase correcting section 10721 conducts phase correction processing on the signal A1' based on the signal A1'ref output by the first Fourier transformation section 1071, and outputs the resulting signal to the second Fourier transformation section 1073. The second phase correcting section 10722 conducts phase correction processing on the signal A2' based on the signal A1'ref output by the first Fourier transformation section 1071, and outputs the resulting signal to the second Fourier transformation section 1073.

The phase correction processing will now be described. Data F(n) after correction, data F'(n) before correction, and data F"(n) after first-order correction are calculated as given by Equations (2), (3) and (4) below, wherein n designates a sample index in the readout direction, and j is an imaginary number.

[Equation 2]
$$F'(n)=F(n)e^{j(A+Bn)} \quad (2)$$

[Equation 3]
$$F''(n)=F'(n)e^{-jBn}=F(n)e^{-jAn} \quad (3)$$

[Equation 4]
$$F(n)=F''(n)e^{-jA} \quad (4)$$

The zero-th order coefficient A and first-order coefficient B of phase distortion are generated from the phase distribution of the data obtained by performing 1DFT in the readout direction on MR signals acquired in the reference scan without applying a phase encoding gradient.

More specifically, given a complex vector Z(n) after the 1DFT in the readout direction as represented by Equation (5), and when data of the next sample is represented by Z(n+1), Z(n+1) is calculated as given by Equation (6).

[Equation 5]
$$Z(n)=x(n)+j\,y(n) \quad (5)$$

[Equation 6]
$$Z(n+1)=X(n+1)+j\,y(n+1) \quad (6)$$

The coefficient B of the first-order phase is calculated as given by Equation (7) using an argument arg of a complex.

[Equation 7]
$$B = \arg\left[\sum_{k=1}^{N-1}\left\{\frac{Z(k+1)}{Z(k)}\right\}\right] \quad (7)$$

The coefficient A of the zero-th order phase is calculated as given by Equation (8) based on the first-order phase coefficient B.

[Equation 8]
$$A = \arg\left\{\sum_{k=1}^{N} Z(k)e^{-jBk}\right\} \quad (8)$$

For an example of the phase correction processing, the first Fourier transformation section 1071 performs 1DFT in the readout direction on the signal RA1ref in the reference scan acquired without applying a phase encoding gradient.

The phase correcting section 1072 generates the first-order phase coefficient B as given by Equation (7) based on the phase distribution of the resulting data from the 1DFT, and generates the zero-th order phase coefficient A as given by Equation (8). The zero-th order phase correction coefficient A and first-order phase correction coefficient B correspond to the phase correction coefficients in accordance with the present invention.

The phase correcting section 10721 conducts phase correction processing on the data A1' in the actual scan based on the coefficient A of the zero-th order phase and coefficient B of the first-order phase as given by Equation (2), and generates a signal A1".

Specifically, the first phase correcting section 10721 generates the coefficient A of the zero-th order phase and coefficient B of the first-order phase based on the signal A1'ref output by the first Fourier transformation section 1071, conducts phase correction processing using Equation (9) below based on the coefficient A of the zero-th order phase, coefficient B of the first-order phase and data A1' to generate the signal A1", and outputs it to the second Fourier transformation section 1073.

[Equation 9]
$$A1''=A1'\cdot e^{-j(A+Bn)} \quad (9)$$

Moreover, the second phase correcting section 10722 generates the coefficient A of the zero-th order phase and coefficient B of the first-order phase based on the signal A1'ref output by the first Fourier transformation section 71, conducts phase correction processing using Equation (10) below based on the coefficient A of the zero-th order phase, coefficient B of the first-order phase and data A2' to generate the signal A2", and outputs it to the second Fourier transformation section 1073.

[Equation 10]
$$A2''=A2'\cdot e^{-j(A+Bn)} \quad (10)$$

The second Fourier transformation section 1073 performs one-dimensional Fourier transformation (1DFT) in the phase encoding direction. The Fourier transformation will be sometimes referred to as inverse Fourier transformation. (Either is applicable by definition.)

Specifically, the second Fourier transformation section 1073 conducts 1DFT in the phase encoding direction on the signals A1" and A2" output from the phase correcting section 1072 to generate signals A1 and A2, and outputs them to the unfolding section 1075.

The second Fourier transformation section 1073 also conducts 1DFT in the phase encoding direction on the signals C1' and C2' to generate signals C1 and C2, and outputs them to the normalizing section 1074.

The normalizing section 1074 conducts normalization processing. More specifically, the normalizing section 1074 conducts normalization processing on C1 and C2 to generate signals S1 and S2, and outputs them to the unfolding section 1075.

The unfolding section 1075 conducts unfolding processing based on the signals A1 and A2 generated by the second Fourier transformation section and the signals S1 and S2 generated by the normalizing section to produce an image V. More specifically, the unfolding section 1075 produces a Full FOV image V using an adjoint (conjugate transpose) S* of S as given by Equation (1).

As described above, since the phase correcting section 1072 conducts phase correction processing on signals RA1 and RA2 received by a plurality of receive coils, for example, by the receive coils 10131 and 10132, in an actual scan, based on a reference signal A1'ref received by one of the plurality of coils to generate signals A1 and A2, the relative phase relationship is preserved between the signals A1 and A2. Moreover, the relative phase relationship is preserved between the calibration signals S1 and S2 even after two-dimensional Fourier transformation.

By conducting unfolding processing (removal processing for wraparound artifacts) by the unfolding section 1075 with the relative phase relationship preserved, a Full FOV image V can be produced with high image quality.

Figure 8:
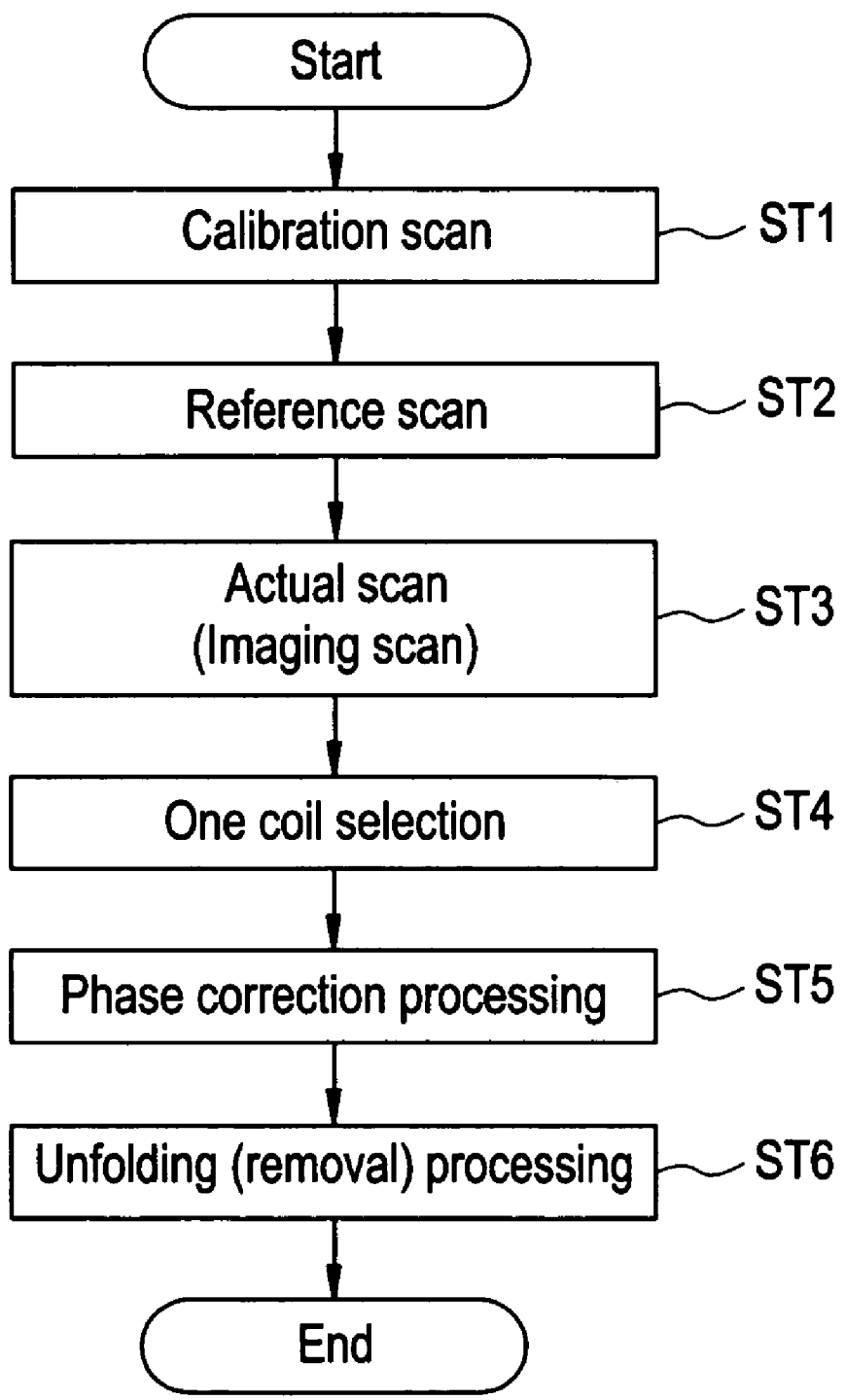
FIG. 8 is a diagram for explaining the operation of the nuclear magnetic resonance imaging apparatus shown in FIG. 1.

FIG. 8 is a diagram for explaining the operation of the nuclear magnetic resonance imaging apparatus shown in FIG. 1. The operation of the nuclear magnetic resonance imaging apparatus will be described with reference to FIG. 8.

At Step ST1, a calibration scan is conducted. The calibration scan conducts a Full FOV scan, for example, and signals received by the receive coils 10131 and 10132 are output to the control section 107 via the preamplifier 105, phase detector 112, and A-D converter 111. The control section 107 takes data of the signals in the calibration scan that are in a low-frequency region in the k-space as calibration signals RC1 and RC2.

At Step ST2, a reference scan is conducted. The reference scan conducts a scan without applying a phase encoding gradient magnetic field Gp.

For example, as shown in FIG. 4, the transmit coil 1012 applies 90° and 180° excitation pulses to the subject p, and the gradient magnetic field coil 1011 applies a readout gradient magnetic field Gr with the polarity consecutively inverted. Meanwhile, the scan is conducted without applying a phase encoding gradient magnetic field Gp.

From the reference scan, reference signals incorporating additive information in the phase encoding direction, employed as a corrective signal, are received at the receive coils 1013, and are output to the control section 107 via the preamplifier 105, phase detector 112 and A-D converter 111.

At Step ST3, an actual scan (imaging scan) is conducted. More specifically, a scan is conducted with scan step skipping in the phase encoding direction. For example, as shown in FIG. 3, the transmit coil 1012 applies 90° and 180° excitation pulses to the subject p, and the gradient magnetic field coil applies a readout gradient magnetic field Gr with the polarity consecutively inverted. Meanwhile, a gradient magnetic field of predetermined magnitude is applied as the phase encoding gradient magnetic field Gp.

The signals received at the receive coils 10131 and 10132 in the actual scan are output to the control section 107 via the preamplifier 105, phase detector 112, and A-D converter 111.

At Step ST4, a reference signal received by one of the plurality of receive coils is selected, and phase correction processing is conducted based on the reference signal (ST5).

Figure 9:
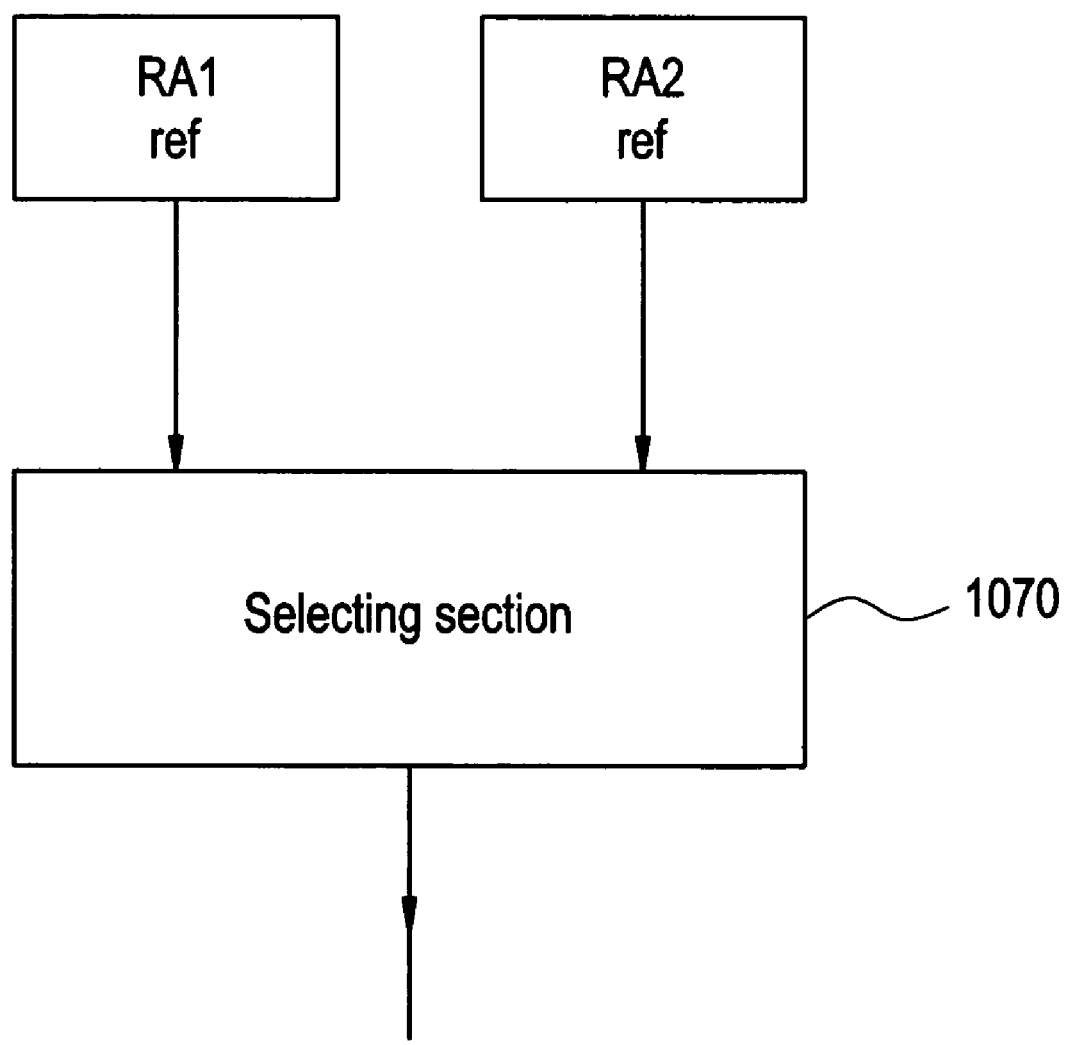
FIG. 9 is a diagram for explaining selection processing by the control section.

FIG. 9 is a diagram for explaining the selection processing by the control section 107.

The control section 107 comprises, for example, a selecting section 1070 for selecting a reference signal, as shown in FIG. 9.

In selecting a signal received by one of the plurality of receive coils 1013, for example, the selecting section 1070 selects a predetermined receive coil, for example, the receive coil 10311, and outputs the selected signal.

The selecting section 1070 is however not limited to the form described above. For example, the selecting section 1070 may select a received signal based on the reception intensities of the plurality of receive coils 1013. It may select a signal received by the one of the receive coils 1013 that has the highest signal intensity, for example, to output the selected signal. Thus, phase correction processing can be achieved with high accuracy in the subsequent processing.

Alternatively, the selecting section 1070 may select a received signal based on the reception sensitivity distributions of the plurality of receive coils 1013. For example, the selecting section 1070 may select a signal received by the one of the receive coils 1013 that has the widest sensitivity distribution to output the selected signal. Thus, phase correction processing can be achieved with high accuracy in the subsequent processing.

Moreover, the selecting section 1070 may select a received signal by producing reception intensity images and selecting the signal based on the two-dimensional integral values in the images. For example, the selecting section 1070 may select a received signal by producing reception intensity images, and selecting a signal received by the one of the receive coils 1013 that has the largest sum of the two-dimensional integral values, i.e., the largest sum of the image intensities, in that image, to output the selected signal. Thus, phase correction processing can be achieved with high accuracy in the subsequent processing.

At Step ST5, a reference signal, for example, a signal RA1ref, received by one of the receive coils 1013 and selected by the selecting section 1070 is subjected to Fourier transformation in the readout direction by the first Fourier transformation section 1071, and the resulting signal A1'ref is output to the phase correcting section 1072.

Moreover, signals RA1 and RA2 received by the receive coils 10131 and 10132 in the actual scan are subjected to Fourier transformation in the readout direction by the first Fourier transformation section 1071, and the resulting signals A1' and A2' are output to the phase correcting section 1072.

In the first phase correcting section 10721, phase correction processing is conducted based on the signals A1' and A1'ref, and the result is output to the second Fourier transformation section 1073.

In the second phase correcting section 10722, phase correction processing is conducted based on the signals A2' and A1'ref, and the result is output to the second Fourier transformation section 1073.

On the other hand, signals RC1 and RC2 acquired in the calibration scan are subjected to Fourier transformation by the first Fourier transformation section 1073, and the resulting signals C1' and C2' are output to the second Fourier transformation section 1073. The signals C1' and C2' are subjected to 1DFT in the phase encoding direction by the second Fourier transformation section 1073, output to the normalizing section 1074 as signals C1 and C2, subjected to normalization processing by the normalizing section 1074, and output to the unfolding section 1075 as signals S1 and S2.

The signals A1" and A2" output from the phase correcting section 1072 are subjected to 1DFT in the phase encoding direction by the second Fourier transformation section 2073, and are output to the unfolding section 1075 as signals A1 and A2.

At Step ST6, the unfolding section 1075 conducts unfolding processing (removal processing) given by Equation 1 based on the signals A1 and A2 output from the second Fourier transformation section 1073 and signals S1 and S2 output from the normalizing section 1074, and a Full FOV image V is produced.

As described above, there are provided the phase correcting section 1072 for conducting phase correction processing on received signals in an actual scan based on a reference signal as a corrective signal incorporating additive information in the phase encoding direction received by one of the plurality of receive coils 1013, for example, by the receive coil 10131, without applying a gradient magnetic field Gp in the phase encoding direction, and the unfolding section 1075 for removing wraparound artifacts in an image based on the signals received by the plurality of receive coils 1013 in the actual scan and subjected to the phase correction processing by the phase correcting section 1072, and on the difference in sensitivity distribution among the plurality of receive coils 1013 generated in a calibration scan, so that the phase correction processing is conducted while preserving the relative phase relationship among the coils, and the unfolding processing (removal processing) is conducted using the result of such phase correction processing; and therefore, wraparound artifacts can be removed without degrading image quality of the image V.

Figure 10:
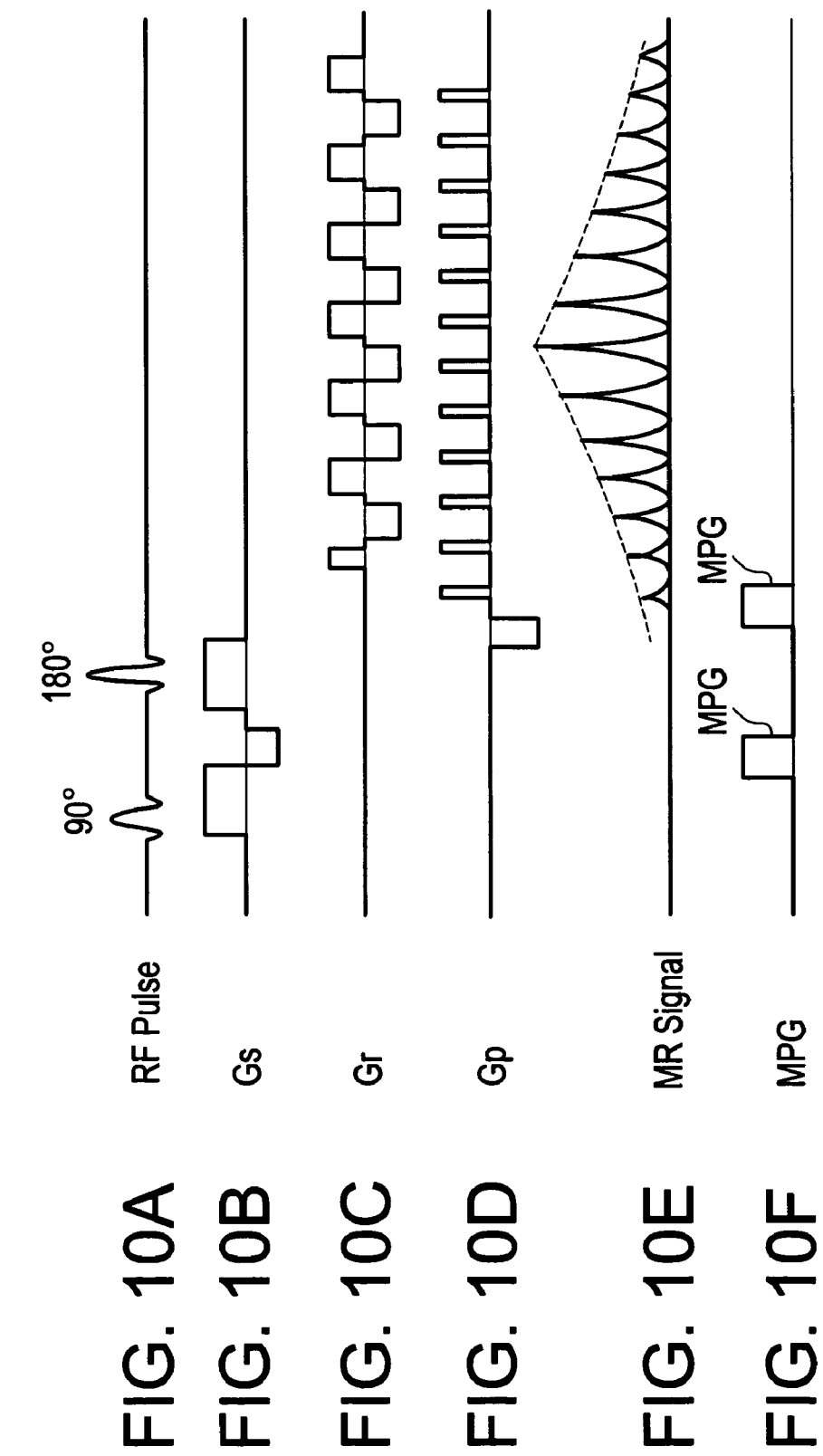
FIG. 10 is a pulse sequence chart for a nuclear magnetic resonance imaging apparatus 100b in accordance with a second embodiment.

FIG. 10 is a chart showing a pulse sequence in a nuclear magnetic resonance imaging apparatus 100b in accordance with a second embodiment.

The nuclear magnetic resonance imaging apparatus 100b in accordance with the second embodiment conducts phase correction processing in the parallel imaging technique as described above using a diffusion-weighted EPI pulse sequence.

The nuclear magnetic resonance imaging apparatus 100b has a similar configuration to that of the nuclear magnetic resonance imaging apparatus 100 in accordance with the first embodiment, and description on the similar components will be omitted and only the difference will be described.

Diffusion occurs from, for example, a random thermal movement process of molecules (Brownian movement). The nuclear magnetic resonance imaging apparatus 100b applies a pair of diffusion-weighted gradient magnetic field MPG (motion probing gradient) pulses before and after the 180° pulse signal as a diffusion-weighted gradient magnetic field, as exemplarily shown in FIG. 10(f), so as to disperse diffusing protons to avoid generation of signals. The diffusion-weighted gradient magnetic field is applied to any one of Gs, Gr, Gp axes.

The nuclear magnetic resonance imaging apparatus 100b appends the diffusion-weighted gradient magnetic field MPG pulses as described above in an actual scan, and receives nuclear magnetic resonance signals with a reduced field of view FOV in the actual scan.

The nuclear magnetic resonance imaging apparatus 100b conducts a reference scan by, for example, a pulse sequence for generating and receiving nuclear magnetic resonance signals without applying a gradient magnetic field Gp in the phase encoding direction, as in the first embodiment. Moreover, the nuclear magnetic resonance imaging apparatus 100b conducts a Full FOV scan and generates sensitivity distributions of the coils based on data in a low-frequency region in the k-space, as in the first embodiment.

The phase correcting section 1072 conducts phase correction processing on the signals received by the plurality of receive coils 1013 in the actual scan based on a reference signal received by one of the receive coils 1013 and subjected to Fourier transformation in the readout direction by the first Fourier transformation section 1071, and outputs the resulting signals to the second Fourier transformation section 1073.

Processing by the other components is similar to that in the first embodiment and explanation thereof will be omitted.

As described above, since the nuclear magnetic resonance imaging apparatus 100b in accordance with the present invention applies diffusion-weighted magnetic field MPG pulses before and after the 180° RF pulse, it can obtain a diffusion-weighted image V, unlike the nuclear magnetic resonance imaging apparatus 100 in accordance with the first embodiment. Moreover, since the phase correction processing is conducted on actual scan signals with a Small FOV based on a reference signal acquired by one receive coil, a Full FOV image with wraparound artifacts removed can be produced without degrading image quality.

A nuclear magnetic resonance imaging apparatus 100c in accordance with a third embodiment produces an image V using the parallel imaging technique and a multi-shot EPI technique.

Known phase errors problematic in a pulse sequence according to the multi-shot EPI technique include a body-motion phase error and magnetic field inhomogeneity phase error due to magnetic field inhomogeneity. The nuclear magnetic resonance imaging apparatus 100c of the present embodiment generates a navigator echo for correcting such phase errors.

Figure 11:
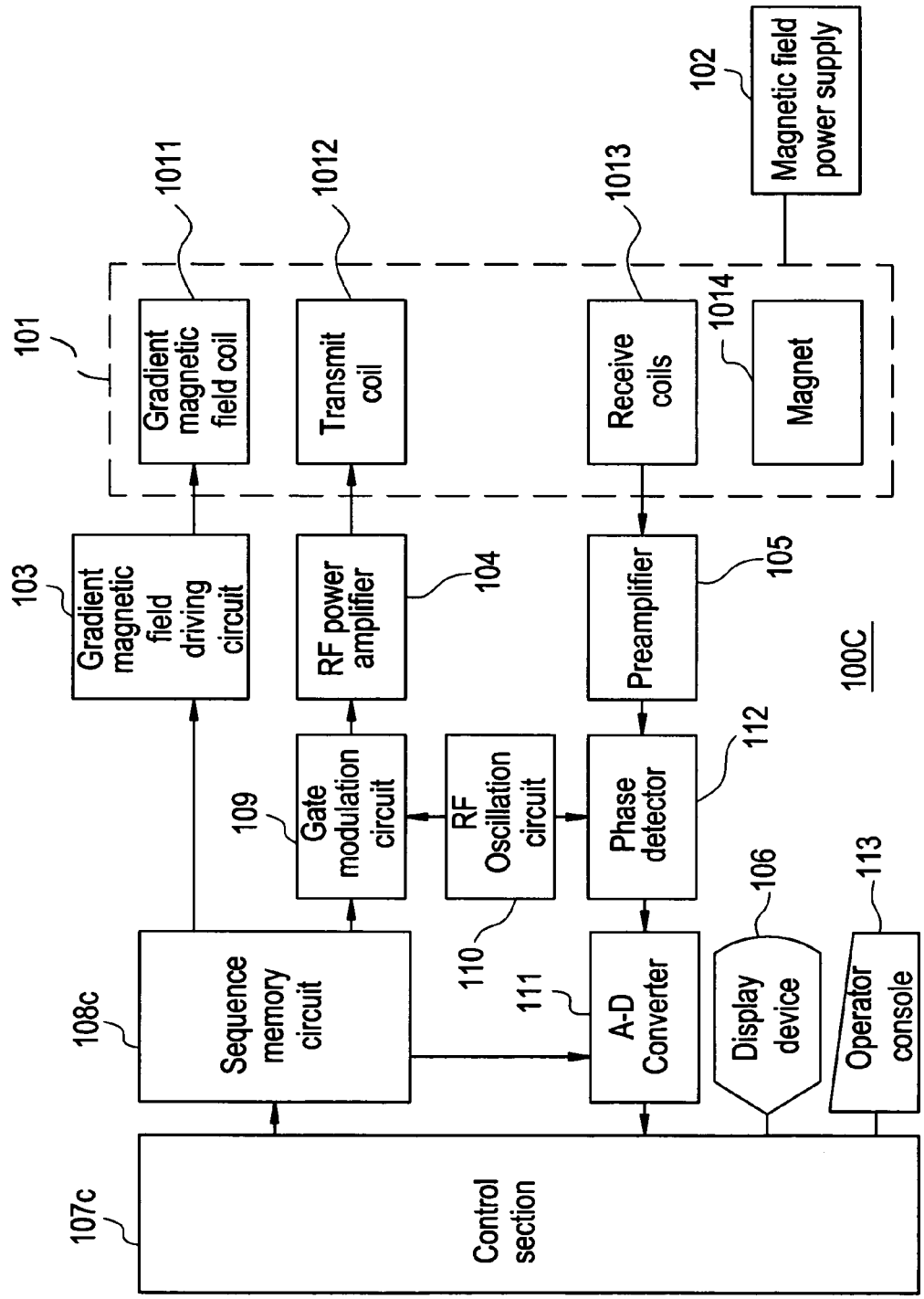
FIG. 11 is a block diagram showing a third embodiment of the nuclear magnetic resonance imaging apparatus in accordance with the present invention.
Figure 12:
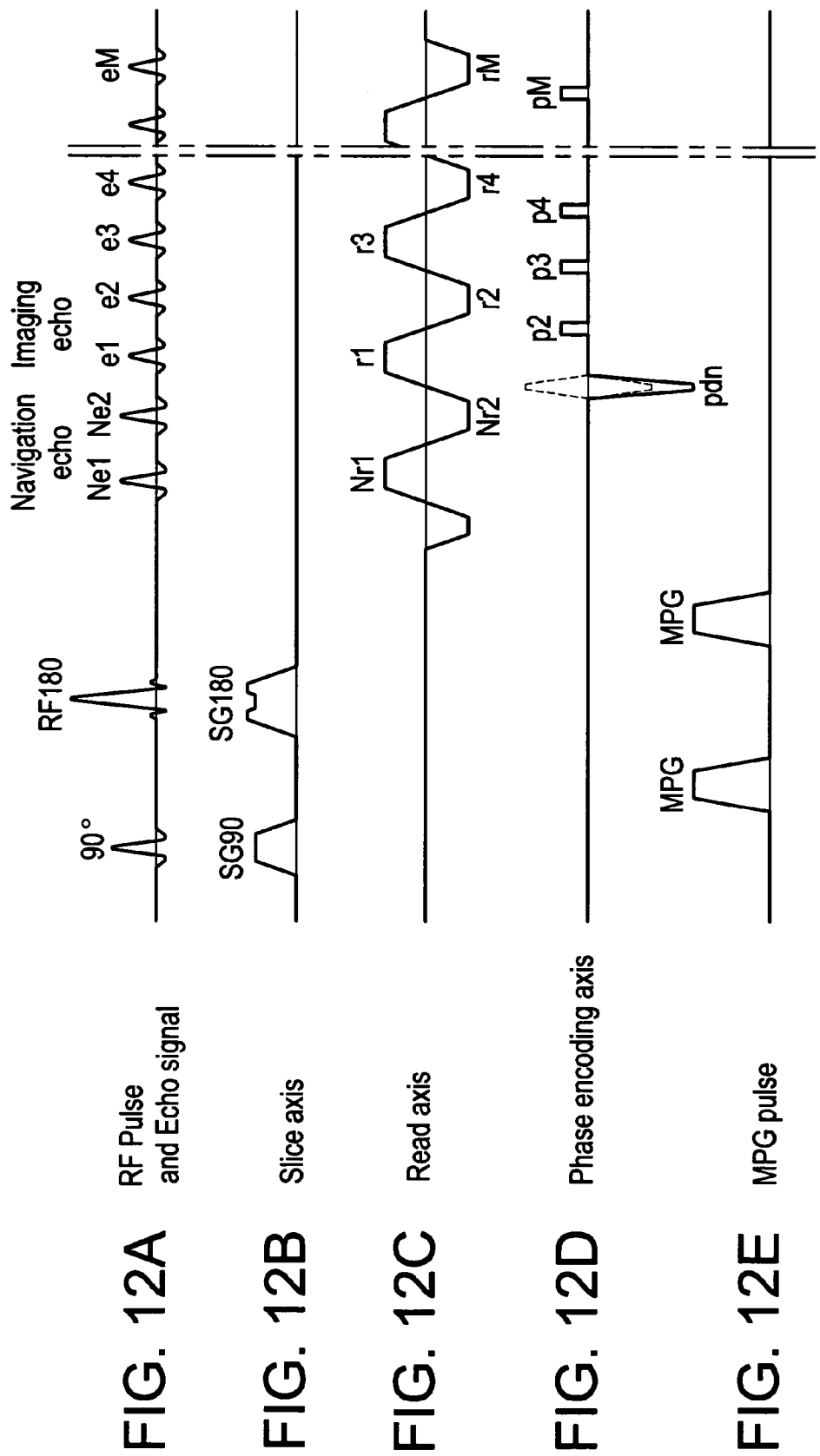
FIG. 12 is a chart of a pulse sequence of a multi-shot diffusion-weighted EPI technique by the nuclear magnetic resonance imaging apparatus shown in FIG. 11.
Figure 13:
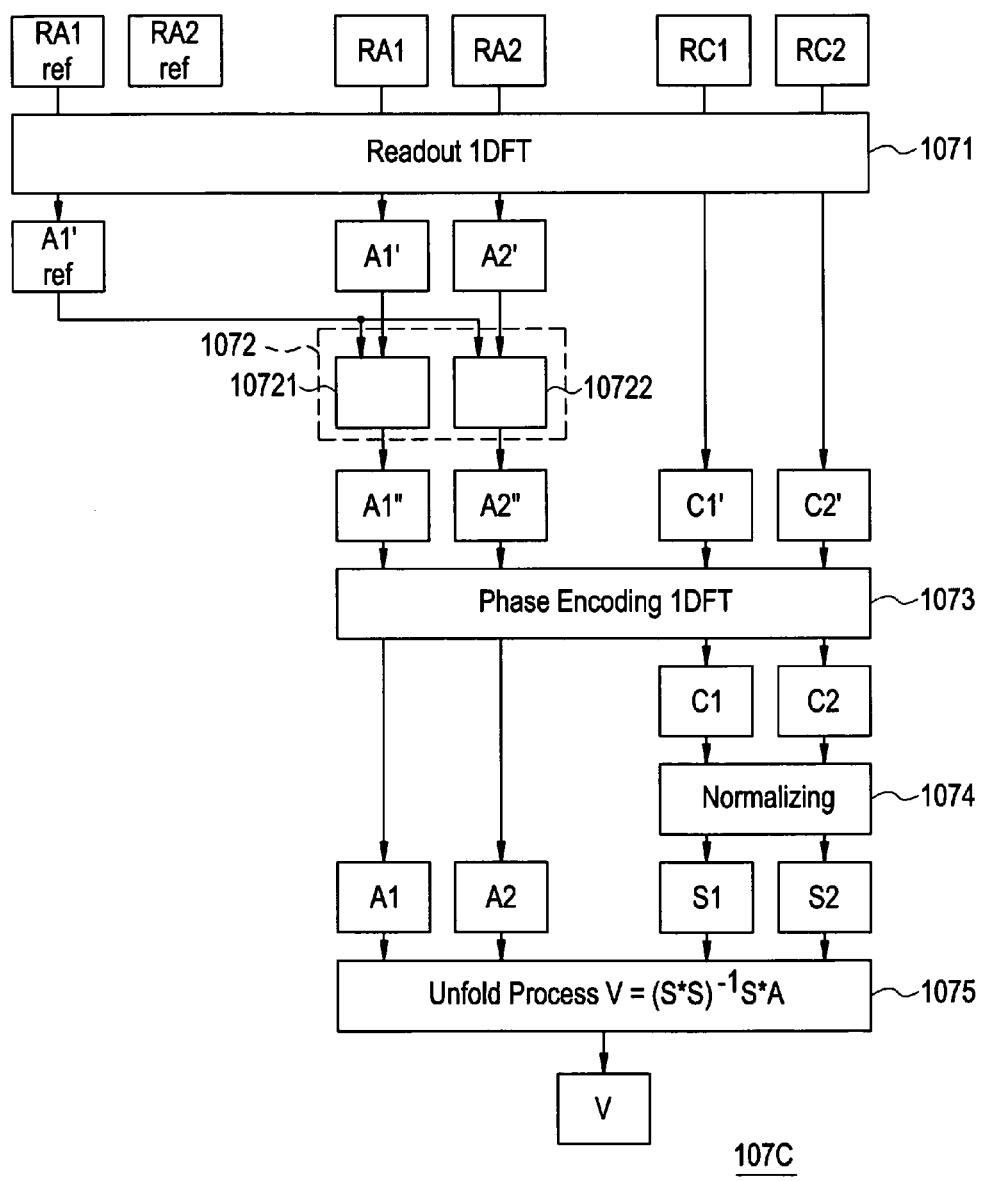
FIG. 13 is a functional block diagram of the control section in the nuclear magnetic resonance imaging apparatus shown in FIG. 11.

FIG. 11 is a block diagram showing the third embodiment of the nuclear magnetic resonance imaging apparatus in accordance with the present invention. FIG. 12 is a pulse sequence chart according to the multi-shot diffusion-weighted EPI technique in the nuclear magnetic resonance imaging apparatus shown in FIG. 11. FIG. 13 is a functional block diagram of the control section in the nuclear magnetic resonance imaging apparatus shown in FIG. 11.

As shown in FIG. 11, the nuclear magnetic resonance imaging apparatus 100c comprises a magnet assembly 101, a magnetic field power supply 102, a gradient magnetic field driving circuit 103, an RF power amplifier 104, a preamplifier 105, a display device 106, a control section 107c, a sequence memory circuit 108c, a gate modulation circuit 109, an RF oscillation circuit 110, an A-D converter 111, a phase detector 112, and an operator console 113.

The nuclear magnetic resonance imaging apparatus 100c has a configuration generally the same as that of the nuclear magnetic resonance imaging apparatus 100 in accordance with the first embodiment, and, for example, the magnet assembly 101 has such a configuration as shown in FIG. 2 similarly to the nuclear magnetic resonance imaging apparatus 100 in accordance with the first embodiment. Similar components are designated by similar reference symbols to those in the first embodiment, and explanation thereof will be omitted.

The major difference between the nuclear magnetic resonance imaging apparatus 100c and the nuclear magnetic resonance imaging apparatus 100 in accordance with the first embodiment is in the sequence memory circuit 108c and control section 107c.

The sequence memory section 108c stores a pulse sequence according to the multi-shot diffusion-weighted EPI technique as shown in FIG. 12, and causes the gradient magnetic field driving circuit 103 to apply predetermined gradient magnetic fields via the gradient magnetic field coil 1011 in response to control by the control section 107c.

The control section 107c takes corrective data obtained by navigator echoes Ne1, Ne2, . . . received by one of the plurality of receive coils 1013 as a corrective signal RA1 of the first embodiment.

Moreover, the control section 107c takes imaging echoes e1, e2, . . . , eM received by the plurality of receive coils 1013, for example, by the receive coils 10131 and 10132, as actual scan signals RA1 and RA2 of the first embodiment.

The following processing is similar to that of the first embodiment; the phase correcting section 1072 conducts phase correction processing on the imaging echo signals based on the navigator echoes, and the unfolding section 1075 conducts unfolding processing (removal processing).

The nuclear magnetic resonance imaging apparatus 100c in accordance with the present embodiment applies a 90° excitation pulse and a slice gradient magnetic field SG90, and applies an MPG (motion probing gradient) pulse after a predetermined time period, as shown in FIG. 12.

Next, the apparatus 100c applies a 180° RF pulse and a slice gradient magnetic field, and applies an MPG pulse after a predetermined time period.

Next, data collection read gradients Nr1, . . . , Nrj (j≧1, and j=2 in FIG. 12) whose polarity alternates between positive and negative are consecutively applied, sampling is conducted at the same time as the first navigator echo Ne1 through j-th navigator echo Nej focusing sequentially, and corrective data H(n, 1), . . . , H(n, j) corresponding to the navigator echoes Ne1, . . . , Nej are collected.

When obtaining the corrective data, no gradient magnetic field is applied in the phase encoding direction. Thus, the nuclear magnetic resonance signals incorporate additive information in the phase encoding direction, as explained regarding the nuclear magnetic resonance imaging apparatus 100 in accordance with the first embodiment. Based on the information, phase correction is conducted.

Subsequently, data collection read gradients r1, . . . , rM that alternate between positive and negative polarities are consecutively applied and also phase encoding gradient magnetic fields pdn, . . . , pM are applied at the times of the polarity inversion, sampling is conducted at the same time as the first echo e1 through M-th echo eM focusing sequentially, and data F(n, 1), . . . , F(n, M) corresponding to the echoes e1, . . . , eM are collected. The process is repeated for n=1, . . . , N with a varying magnitude of the phase encoding gradient pdn to collect F(1, 1)–F(N, M) that fill the k-space.

The control section 107c takes the corrective data H(n, 1), . . . , H(n, j) obtained by one of the plurality of receive coils 1013, for example, by the receive coil 10131, as the reference signal RA1ref of the first embodiment, and conducts phase correction processing on the coils F(1, 1)–F(N, M) received by the plurality of receive coils 1013 as the signals RA1 and RA2 of the first embodiment.

Moreover, the nuclear magnetic resonance imaging apparatus 100c receives signals RC1 and RC2 by the receive coils 1013 in a calibration scan beforehand, as in the first embodiment.

The control section 107c conducts unfolding (removal processing) processing based on the calibration signals RC1 and RC2.

The operation of the aforementioned configuration will be briefly described below.

First, a calibration scan is conducted. The calibration scan conducts, for example, a Full FOV scan, and signals received by the receive coils 10131 and 10132 are output to the control section 107 via the preamplifier 105, phase detector 112, and A-D converter 111. The control section 107 takes data of the signals acquired in the calibration scan that are in a low-frequency region in the k-space as calibration signals RC1 and RC2.

Navigator echoes and imaging echoes are generated according to the multi-shot diffusion-weighted EPI pulse sequence. The navigator echo signals are acquired by conducting a scan without applying a phase encoding gradient magnetic field Gp, as shown in FIG. 12.

The navigator echo signal is acquired with scan step skipping in the phase encoding direction.

The signals received at the receive coils 10131 and 10132 according to the multi-shot diffusion-weighted EPI pulse sequence are output to the control section 107c via the preamplifier 105, phase detector 112 and A-D converter 111.

The control section 107c takes the corrective data H(n, 1), . . . , H(n, j) corresponding to the navigator echoes Ne1, . . . , Nej received by one of the plurality of receive coils 1013 as the signal RA1ref.

Moreover, it takes the coils F(1, 1)–F(N, M) received by the plurality of receive coils 10131 and 10132 as the signals RA1 and RA2 of the first embodiment.

Thereafter, the signal RA1ref is subjected to Fourier transformation in the readout direction by the first Fourier transformation section 1071, and the resulting signal A1'ref is output to the phase correcting section 1072, as in the first embodiment.

The signals RA1 and RA2 received by the receive coils 10131 and 10132 are subjected to Fourier transformation in the readout direction by the first Fourier transformation section 1071, and the resulting signals A1' and A2' are output to the phase correcting section 1072.

The first phase correcting section 10721 conducts phase correction processing based on the signals A1' and A1'ref, and the resulting signal is output to the second Fourier transformation section 1073.

The second phase correcting section 10722 conducts phase correction processing based on the signals A2' and A1'ref, and the resulting signal is output to the second Fourier transformation section 1073.

On the other hand, the signals RC1 and RC2 acquired in the calibration scan are subjected to Fourier transformation by the first Fourier transformation section 1073, and the resulting signals C1' and C2' are output to the second Fourier transformation section 2073. The signal C1' and signal C2' are subjected to 1DFT in the phase encoding direction by the second Fourier transformation section 1073, output to the normalizing section 1074 as signals C1 and C2, subjected to normalization processing by the normalizing section 1074, and output to the unfolding section 1075 as signals S1 and S2.

The signals A1" and A2" output from the phase correcting section 1072 are subjected to 1DFT in the phase encoding direction by the second Fourier transformation section 2073, and output to the unfolding section 1075 as signals A1 and A2.

The unfolding section 1075 conducts unfolding processing (removal processing) as given by Equation (1) based on the signals A1 and A2 output from the second Fourier transformation section 1073 and on the signals S1 and S2 output from the normalizing section 1074 to produce a Full FOV image V.

As described above, in this embodiment, there are provided the phase correcting section 1072 for conducting phase correction processing on imaging echo signals received by the plurality of receive coils 1013, by generating navigator echo signals using the parallel imaging technique and multi-shot diffusion EPI technique, and using a navigator echo signal received by one of the plurality of receive coils 1013 as corrective signal, and the unfolding section 1075 for removing wraparound artifacts in an image based on the imaging echo signals subjected to phase correction processing by the phase correcting section 1072, and on the difference in sensitivity distribution among the plurality of receive coils 1013 generated by a calibration scan, so that the phase correction processing is conducted while preserving the relative phase relationship among the coils, and unfolding processing (removal processing) is conducted using the result of such phase correction processing; and therefore, wraparound artifacts can be removed without degrading image quality of the image V.

Moreover, since the phase correction processing is conducted in the parallel imaging technique with the multi-shot diffusion-weighted EPI, a Full FOV image can be obtained at a high speed and with high image quality.

It should be noted that the present invention is not limited to this embodiment but may be practiced with any suitable modification.

Although phase correction processing on imaging echo signals received by the plurality of receive coils 1013 is conducted based on a navigator echo signal received by a predetermined one of the plurality of receive coils 1013 in this embodiment, the present invention is not limited to this configuration. For example, a selecting section may be provided as in the nuclear magnetic resonance imaging apparatus of the first embodiment to select a navigator echo signal received by one of the receive coils based on the reception intensity, width of the sensitivity distribution, or two-dimensional integral values.

Furthermore, although two receive coils are exemplarily employed in the first, second and third embodiments, the present invention is not limited to this configuration. For example, more receive coils 1013 may be provided, and phase correction processing may be conducted based on a signal received by one of these receive coils to obtain a high quality image V.

Many widely different embodiments of the invention may be configured without departing from the spirit and the scope of the present invention. It should be understood that the present invention is not limited to the specific embodiments described in the specification, except as defined in the appended claims.

The invention claimed is:

1. A nuclear magnetic resonance imaging apparatus for removing wraparound artifacts from an image produced from signals received by a plurality of coils based on the difference in sensitivity distribution among said plurality of coils, said apparatus comprising:

a phase correction processing device for conducting phase correction processing on the signals received by said plurality of coils based on a corrective signal received by one of said plurality of coils while applying no gradient magnetic field in a phase encoding direction; and a removing device for removing wraparound artifacts in said image based on the signals received by said plurality of coils and subjected to said phase correction processing by said phase correction processing device, and on the difference in sensitivity distribution among said plurality of coils.

2. The nuclear magnetic resonance imaging apparatus of claim 1, wherein:

said apparatus further comprises Fourier transformation processing device for conducting Fourier transformation processing in the phase encoding direction, and said phase correction processing device generates phase correction coefficients based on the result obtained by conducting, by said Fourier transformation processing device, Fourier-transformation processing on the corrective signal received by one of said plurality of coils while applying no gradient magnetic field in the phase encoding direction; and based on said phase correction coefficients, conducts the phase correction processing on the signals received by said plurality of coils with reduced scan steps and with phase encoding, and subjected to the Fourier transformation processing by said Fourier transformation processing device.

3. The nuclear magnetic resonance imaging apparatus of claim 1, wherein:

said phase correction device selects one of said plurality of coils based on the signal intensities of said plurality of coils, and based on said corrective signal received by said selected coil, conducts the phase correction processing on the signals received by said plurality of coils.

4. The nuclear magnetic resonance imaging apparatus of claim 1, wherein:

said phase correction device selects one of said plurality of coils based on the sensitivity distributions of said plurality of coils, and based on said corrective signal received by said selected coil, conducts the phase correction processing on the signals received by said plurality of coils.

5. The nuclear magnetic resonance imaging apparatus of claim 1, wherein:

said phase correction device selects one of said plurality of coils based on two-dimensional integral values in respective signal intensity images of said plurality of coils, and based on said corrective signal received by said selected coil, conducts the phase correction processing on the signals received by said plurality of coils.

6. The nuclear magnetic resonance imaging apparatus of claim 1, wherein:

said apparatus further comprises gradient magnetic field generating device for generating gradient magnetic fields in a readout direction, a frequency encoding direction, and a phase encoding direction, and said phase correction device conducts the phase correction processing on the signals received by said plurality of coils based on said corrective signal received by one of said plurality of coils while applying no gradient magnetic field at least in said phase encoding direction by said gradient magnetic field generating device.

7. The nuclear magnetic resonance imaging apparatus of claim 6, wherein:

said apparatus further comprises pulse generating device for applying 90° and 180° pulses for exciting nuclear magnetization;

said gradient magnetic field generating device applies a gradient magnetic field in said readout direction with the polarity consecutively inverted a plurality of times; and said correcting device removes wraparound artifacts in an image produced based on the signals received by said plurality of coils while applying the 90° and 180° pulses by said pulse generating device, and applying the gradient magnetic field in said readout direction with the polarity consecutively inverted a plurality of times by said gradient magnetic field generating device.

8. The nuclear magnetic resonance imaging apparatus of claim 6, wherein:

said gradient magnetic field generating device applies a diffusion-weighted gradient magnetic field before and after said 180° pulse applied by said pulse generating device, and applies said gradient magnetic field in said readout direction with the polarity consecutively inverted; and said correcting device removes wraparound artifacts in an image produced based on the signals received by said plurality of coils while applying said diffusion-weighted gradient magnetic field and applying said gradient magnetic field in said readout direction with the polarity consecutively inverted by said gradient magnetic field generating device.

9. A nuclear magnetic resonance imaging apparatus for removing wraparound artifacts from an image produced from signals received by a plurality of coils based on the difference in sensitivity distribution among said plurality of coils, said apparatus comprising:

a gradient magnetic field generating device for generating gradient magnetic fields in a readout direction, a frequency encoding direction and a phase encoding direction;

a pulse generating device for applying 90° and 180° pulses for exciting nuclear magnetization;

a phase correcting device for, based on one of navigator signals received by one of said coils while applying no gradient magnetic field in said phase encoding direction and applying said gradient magnetic field in said readout direction by said gradient magnetic field generating device within the same excitation period, conducting phase correction processing on the signals received by said plurality of coils while applying a gradient magnetic field in said phase encoding direction and applying a gradient magnetic field in said readout direction with the polarity consecutively inverted by said gradient magnetic field generating device within an excitation period; and a removing device for removing wraparound artifacts in said image based on the signals received by said plurality of coils and subjected to said phase correction processing by said phase correction processing device, and on the difference in sensitivity distribution among said plurality of coils.

10. A nuclear magnetic resonance imaging method for removing wraparound artifacts from an image produced from signals received by a plurality of coils based on the difference in sensitivity distribution among said plurality of coils, said method comprising:

a first step of conducting phase correction processing on the signals received by said plurality of coils based on a corrective signal received by one of said plurality of coils while applying no gradient magnetic field in a phase encoding direction; and a second step of removing wraparound artifacts in said image based on the signals received by said plurality of coils and subjected to said phase correction processing by said first step, and on the difference in sensitivity distribution among said plurality of coils.

11. The nuclear magnetic resonance imaging method of claim 10, wherein:

said first step generates phase correction coefficients based on the result obtained by conducting Fourier transformation processing on the corrective signal received by one of said plurality of coils while applying no gradient magnetic field in the phase encoding direction; and based on said phase correction coefficients, conducts the phase correction processing on the result of the Fourier transformation processing on the signals received by said plurality of coils with scan step skipping and with phase encoding.

12. The nuclear magnetic resonance imaging method of claim 10, wherein:

said first step selects one of said plurality of coils based on the signal intensities of said plurality of coils, and based on said corrective signal received by said selected coil, conducts the phase correction processing on the signals received by said plurality of coils.

13. The nuclear magnetic resonance imaging method of claim 10, wherein:

said first step selects one of said plurality of coils based on the sensitivity distributions of said plurality of coils, and based on the corrective signal received by said selected coil, conducts the phase correction processing on the signals received by said plurality of coils.

14. The nuclear magnetic resonance imaging method of claim 10, wherein:

said first step selects one of said plurality of coils based on two-dimensional integral values in respective signal intensity images of said plurality of coils, and based on said corrective signal received by said selected coil, conducts the phase correction processing on the signals received by said plurality of coils.

15. The nuclear magnetic resonance imaging method of claim 10, wherein:

said first step conducts the phase correction processing on the signals received by said plurality of coils based on said corrective signal received by one of said plurality of coils while applying no gradient magnetic field in the phase encoding direction.

16. The nuclear magnetic resonance imaging method of claim 10, wherein:

said second step removes wraparound artifacts in an image produced based on said signals received by said coils while exciting nuclear magnetization by 90° and 180° pulses, and applying the gradient magnetic field in the readout direction with the polarity consecutively inverted a plurality of times.

17. The nuclear magnetic resonance imaging method of claim 16, wherein:

said second step removes wraparound artifacts in an image produced based on the signals received by said plurality of coils while applying a diffusion-weighted gradient magnetic field before and after said 180° pulse, and applying the readout gradient magnetic field with the polarity inverted.

18. A nuclear magnetic resonance imaging method for removing wraparound artifacts from an image produced from signals received by a plurality of coils based on the difference in sensitivity distribution among said plurality of coils, said method comprising:

a first step of conducting phase correction processing on the signals received by said plurality of coils while applying a gradient magnetic field in a phase encoding direction and applying a gradient magnetic field in a readout direction with the polarity consecutively inverted within an excitation period, based on one of navigator signals received by one of said coils while applying no gradient magnetic field in said phase encoding direction and applying said gradient magnetic field in said readout direction within the same excitation period; and a second step of removing wraparound artifacts in said image based on the signals received by said plurality of coils and subjected to said phase correction processing by said first step, and on the difference in sensitivity distribution among said plurality of coils.

* * * * *